United States Patent
Takahashi

(10) Patent No.: US 10,752,820 B2
(45) Date of Patent: Aug. 25, 2020

(54) SURFACE-MODIFIED INORGANIC NITRIDE, COMPOSITION, THERMALLY CONDUCTIVE MATERIAL, DEVICE WITH THERMALLY CONDUCTIVE LAYER, AND METHOD FOR MANUFACTURING SURFACE-MODIFIED INORGANIC NITRIDE

(71) Applicant: FUJIFILM Corporation, Tokyo (JP)

(72) Inventor: Keita Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 30 days.

(21) Appl. No.: 16/198,799

(22) Filed: Nov. 22, 2018

(65) Prior Publication Data

US 2019/0085229 A1   Mar. 21, 2019

Related U.S. Application Data

(63) Continuation of application No. PCT/JP2017/017410, filed on May 8, 2017.

(30) Foreign Application Priority Data

May 25, 2016 (JP) ................. 2016-103945

(51) Int. Cl.

| | |
|---|---|
| C09K 5/14 | (2006.01) |
| C08L 101/00 | (2006.01) |
| C01B 21/072 | (2006.01) |
| C08G 59/50 | (2006.01) |
| C01B 21/064 | (2006.01) |
| C08G 59/68 | (2006.01) |
| C08G 59/32 | (2006.01) |
| C08K 3/38 | (2006.01) |
| C08G 59/24 | (2006.01) |
| C08K 9/04 | (2006.01) |
| H01L 23/373 | (2006.01) |
| C08K 5/18 | (2006.01) |
| C08K 3/28 | (2006.01) |
| C08K 5/00 | (2006.01) |
| C08K 5/14 | (2006.01) |
| C08K 3/22 | (2006.01) |

(52) U.S. Cl.
CPC ............ *C09K 5/14* (2013.01); *C01B 21/0648* (2013.01); *C01B 21/0728* (2013.01); *C08G 59/245* (2013.01); *C08G 59/3218* (2013.01); *C08G 59/3236* (2013.01); *C08G 59/506* (2013.01); *C08G 59/5033* (2013.01); *C08G 59/686* (2013.01); *C08K 3/38* (2013.01); *C08K 9/04* (2013.01); *C08L 101/00* (2013.01); *H01L 23/3737* (2013.01); *C01P 2002/84* (2013.01); *C08K 3/22* (2013.01); *C08K 3/28* (2013.01); *C08K 5/0025* (2013.01); *C08K 5/14* (2013.01); *C08K 5/18* (2013.01); *C08K 2003/2227* (2013.01); *C08K 2003/282* (2013.01); *C08K 2003/385* (2013.01); *C08K 2201/001* (2013.01)

(58) Field of Classification Search
CPC ......................... C01B 21/0648; C01B 21/0728
See application file for complete search history.

(56) References Cited

U.S. PATENT DOCUMENTS

| | | | |
|---|---|---|---|
| 2005/0211954 A1* | 9/2005 | Takahashi ............ | C07D 213/74 252/299.4 |
| 2007/0041918 A1 | 2/2007 | Meneghetti et al. | |
| 2007/0054122 A1* | 3/2007 | Paisner .................... | C08K 9/06 428/403 |
| 2017/0095784 A1 | 4/2017 | Kobayashi et al. | |

FOREIGN PATENT DOCUMENTS

| | | |
|---|---|---|
| JP | 2006257392 | 9/2006 |
| JP | 2014142575 | 8/2014 |
| JP | 2015187057 | 10/2015 |
| WO | 2015159635 | 10/2015 |

OTHER PUBLICATIONS

"International Search Report (Form PCT/ISA/210) of PCT/JP2017/017410," dated Aug. 8, 2017, with English translation thereof, pp. 1-5.
"International Preliminary Report on Patentability (Form PCT/IPEA/409) of PCT/JP2017/017410," completed on Jun. 6, 2017, with English translation thereof, pp. 1-15.

* cited by examiner

*Primary Examiner* — Robert T Butcher
(74) *Attorney, Agent, or Firm* — JCIPRNET

(57) ABSTRACT

Provided are a novel surface-modified inorganic nitride, a composition, a thermally conductive material, a device with a thermally conductive layer, and a method for manufacturing a surface-modified inorganic nitride. The surface-modified inorganic nitride of the embodiment of the present invention contains an inorganic nitride and an onium salt adsorbed onto a surface of the inorganic nitride.

20 Claims, 1 Drawing Sheet

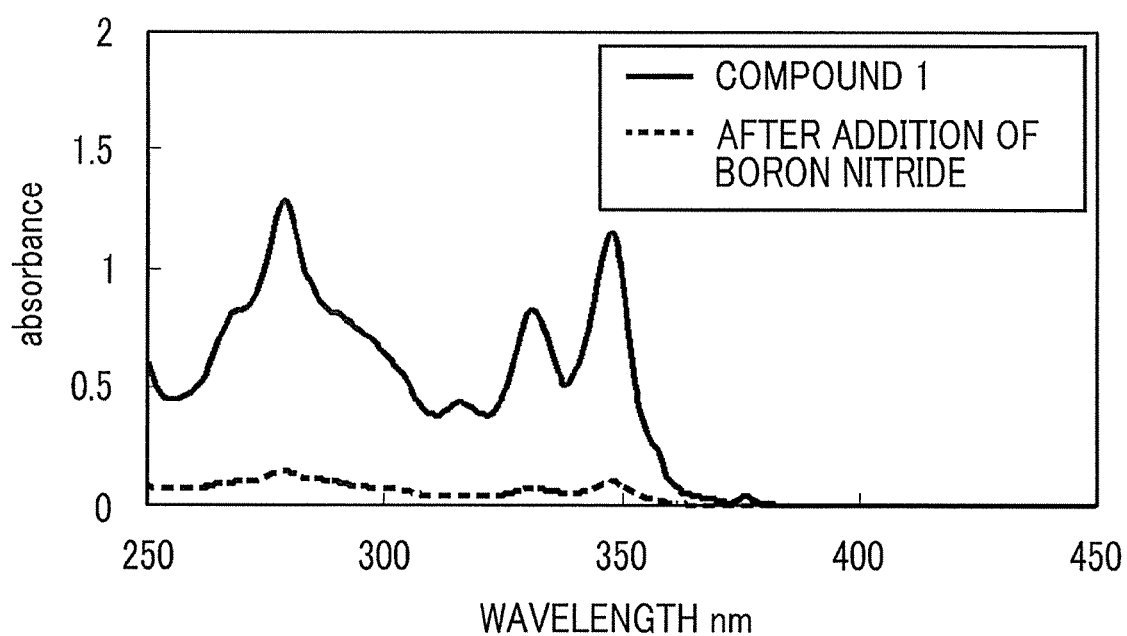

SURFACE-MODIFIED INORGANIC NITRIDE, COMPOSITION, THERMALLY CONDUCTIVE MATERIAL, DEVICE WITH THERMALLY CONDUCTIVE LAYER, AND METHOD FOR MANUFACTURING SURFACE-MODIFIED INORGANIC NITRIDE

CROSS-REFERENCE TO RELATED APPLICATIONS

This application is a Continuation of PCT International Application No. PCT/JP2017/017410 filed on May 8, 2017, which claims priority under 35 U.S.C. § 119(a) to Japanese Patent Application No. 2016-103945 filed on May 25, 2016. The above application is hereby expressly incorporated by reference, in its entirety, into the present application.

BACKGROUND OF THE INVENTION

1. Field of the Invention

The present invention relates to a surface-modified inorganic nitride, a composition, a thermally conductive material, a device with a thermally conductive layer, and a method for manufacturing a surface-modified inorganic nitride.

2. Description of the Related Art

In order to widen the range of applications of an inorganic nitride, a method of modifying the surface of the inorganic nitride has been suggested.

For example, JP2006-257392A discloses a method of treating the surface of boron nitride, which is an inorganic nitride, with a zirconate coupling agent, a zirconium aluminate coupling agent, or an aluminate coupling agent.

SUMMARY OF THE INVENTION

In a case where an inorganic nitride is used by being mixed with an organic substance such as a resin binder, the inorganic nitride is required to exhibit further improved affinity with the organic substance. For example, in a case where an inorganic nitride such as boron nitride is used as a thermally conductive material by being mixed with an organic substance, in view of further improving the thermal conductivity, the improvement of the dispersibility of the inorganic nitride in the organic substance is desired. In order to improve the dispersibility of the inorganic nitride, the surface of the inorganic nitride needs to be modified.

However, with the surface treatment method described in JP2006-257392A, because the inorganic nitride has a small number of hydroxyl groups, which become points of a reaction with a coupling agent, on the surface thereof, it is difficult to sufficiently modify the surface of the inorganic nitride.

Therefore, an object of the present invention is to provide a novel surface-modified inorganic nitride.

Furthermore, another object of the present invention is to provide a composition, a thermally conductive material, and a device with a thermally conductive layer which contain the surface-modified inorganic nitride.

In addition, a still another object of the present invention is to provide a method for manufacturing the surface-modified inorganic nitride.

Regarding the aforementioned objects, the inventors of the present invention conducted a thorough examination. As a result, the inventors have found that the objects can be achieved by using an onium salt.

That is, the inventors have found that the objects can be achieved by the following constitution.

(1) A surface-modified inorganic nitride comprising an inorganic nitride and an onium salt adsorbed onto a surface of the inorganic nitride.

(2) The surface-modified inorganic nitride described in (1), in which the onium salt is at least one kind of salt selected from the group consisting of a pyridinium salt, an imidazolium salt, a pyrrolidinium salt, a piperidinium salt, and a triethylenediamine salt.

(3) The surface-modified inorganic nitride described in (1) or (2), in which the onium salt has a group represented by General Formula (1) which will be described later.

(4) The surface-modified inorganic nitride described in any one of (1) to (3), in which the onium salt is a compound represented by General Formula (3) which will be described later.

(5) The surface-modified inorganic nitride described in (4), in which the onium salt is a compound represented by General Formula (9) which will be described later.

(6) The surface-modified inorganic nitride described in (4) or (5), in which $C^+$ is a group represented by General Formula (4) which will be described later.

(7) The surface-modified inorganic nitride described in any one of (1) to (6), in which the inorganic nitride contains at least one kind of atom selected from the group consisting of a boron atom, an aluminum atom, and a silicon atom.

(8) The surface-modified inorganic nitride described in any one of (1) to (7), in which the inorganic nitride contains at least one kind of nitride selected from the group consisting of boron nitride and aluminum nitride.

(9) A composition comprising the surface-modified inorganic nitride described in any one of (1) to (8) and a curable compound.

(10) The composition described in (9), in which the curable compound has a group selected from the group consisting of an oxiranyl group, an oxetanyl group, an acryloyl group, and a methacryloyl group.

(11) The composition described in (9) or (10), in which the curable compound or a cured substance thereof exhibits liquid crystallinity.

(12) The composition described in any one of (9) to (11) that is used for forming a thermally conductive material.

(13) A thermally conductive material comprising the surface-modified inorganic nitride described in any one of (1) to (8).

(14) The thermally conductive material described in (13) that is in the form of a sheet.

(15) The thermally conductive material described in (13) or (14) that is used in a heat dissipation sheet.

(16) A device with a thermally conductive layer comprising a device and a thermally conductive layer which is disposed on the device and contains the thermally conductive material described in any one of (13) to (15).

(17) A method for manufacturing the surface-modified inorganic nitride described in any one of (1) to (8), comprising a step of bringing the inorganic nitride into contact with the onium salt.

According to the present invention, it is possible to provide a novel surface-modified inorganic nitride.

Furthermore, according to the present invention, it is possible to provide a composition, a thermally conductive material, and a device with a thermally conductive layer which contain the surface-modified inorganic nitride.

In addition, according to the present invention, it is possible to provide a method for manufacturing the surface-modified inorganic nitride.

BRIEF DESCRIPTION OF THE DRAWINGS

The FIGURE shows ultraviolet•visible absorption spectra of a solution obtained before and after the addition of boron nitride.

DESCRIPTION OF THE PREFERRED EMBODIMENTS

Hereinafter, the present invention will be specifically described.

In the present specification, "to" means that the numerical values listed before and after "to" are a lower limit and an upper limit respectively.

In the present specification, the description of "(meth) acryloyl group" means "either or both of an acryloyl group and a methacryloyl group".

In the present specification, an oxiranyl group is a functional group which is also referred to as an epoxy group. For example, a group, in which two adjacent carbon atoms of a saturated hydrocarbon ring group are bonded to each other through an oxo group (—O—) such that an oxirane ring is formed, and the like are also included in the oxiranyl group.

In the present specification, a carboxylic acid anhydride group may be a substituent which is obtained by removing any hydrogen atom from an acid anhydride such as maleic acid anhydride, phthalic acid anhydride, pyromellitic acid anhydride, or trimellitic acid anhydride.

In the present specification, "surface-modified inorganic nitride" means an inorganic nitride whose surface is modified with an onium salt.

In the present specification, "surface-modified" means a state where an onium salt is adsorbed onto at least a portion of the surface of an inorganic nitride. The way the onium salt is adsorbed is not particularly limited, but it is preferable that the onium salt is in a bonded state. "Surface-modified" also includes a state where an organic group (for example, a cationic group) obtained by the dissociation of a portion of an onium salt forms a bond with the surface of an inorganic nitride. The bond may be any one of a covalent bond, a coordinate bond, an ionic bond, a hydrogen bond, a van der Waals bond, and a metallic bond. In the "surface-modified" state, a monolayer may be formed on at least a portion of the surface of the inorganic nitride.

In the present specification, only a portion of the surface of the inorganic nitride may be modified, or the entire surface of the inorganic nitride may be modified.

In the present specification, in a case where the description of "may have a substituent" appears, the type of a substituent, the position of a substituent, and the number of substituents are not particularly limited. The number of substituents may be, for example, 1, 2, 3, or greater. Examples of the substituent include a group of monovalent nonmetallic atoms excluding a hydrogen atom, and the substituent can be selected from the following substituent group Y, for example.

Substituent group Y: halogen atom (—F, —Br, —Cl, or —I), a hydroxyl group, an alkoxy group, an aryloxy group, a thiol group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acylthio group, an acylamino group, a N-alkylacylamino group, a N-arylacylamino group, aureide group, a N'-alkylarylureide group, a N',N'-dialkylureide group, a N'-arylureide group, a N',N'-diarylureide group, a N'-alkyl-N-arylureide group, a N-alkylureide group, a N-arylureide group, a N'-alkyl-N-alkylureide group, a N'-alkyl-N-arylureide group, a N',N'-dialkyl-N-alkylureide group, a N',N'-dialkyl-N-arylureide group, a N'-aryl-N-alkylureide group, a N'-aryl-N-arylureide group, a N',N'-diaryl-N-alkylureide group, a N',N'-diaryl-N-arylureide group, a N'-alkyl-N'-aryl-N-alkylureide group, a N'-alkyl-N'-aryl-N-arylurcide group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group and a conjugated base group thereof, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsufinyl group, an arylsulfinyl group, an alkylsulfonyl group, an arylsulfonyl group, a sulfo group (—SO₃H) and a conjugated base group thereof, an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a N-acylsulfamoyl group and a conjugated base group thereof, a N-alkylsulfonylsulfamoyl group (—SO₂NHSO₂(alkyl)) and a conjugated base group thereof, a N-arylsulfonylsulfamoyl group (—SO₂NHSO₂(aryl)) and a conjugated base group thereof, a N-alkylsulfonylcarbamoyl group (—CONHSO₂(alkyl)) and a conjugated base group thereof, a N-arylsulfonylcarbamoyl group (—CONHSO₂(aryl)) and a conjugated base group thereof, an alkoxysilyl group (—Si(Oalkyl)₃), an aryloxysilyl group (—Si(Oaryl)₃), a hydroxysilyl group (—Si(OH)₃) and a conjugated base group thereof, a phosphono group (—PO₃H₂) and a conjugated base group thereof, a dialkylphosphono group (—PO₃(alkyl)₂), a diarylphosphono group (—PO₃(aryl)₂), an alkylarylphosphono group (—PO₃(alkyl)(aryl)), a monoalkylphosphono group (—PO₃H(alkyl)) and a conjugated base group thereof, a monoarylphosphono group (—PO₃H(aryl)) and a conjugated base group thereof, a phosphonooxy group (—OPO₃H₂) and a conjugated base group thereof, a dialkylphosphonooxy group (—OPO₃(alkyl)₂), a diarylphosphonooxy group (—OPO₃(aryl)₂), an alkylarylphosphonooxy group (—OPO₃(alkyl)(aryl)), a monoalkylphosphonooxy group (—OPO₃H(alkyl)) and a conjugated base group thereof, a monoarylphosphonooxy group (—OPO₃H(aryl)) and a conjugated base group thereof, a cyano group, a nitro group, an aryl group, an alkyl group, a heterocyclic group, an alkenyl group, and an alkynyl group.

These substituents may form a ring with each other if possible or may form a ring by being bonded to the group substituted with the substituents.

In the surface-modified inorganic nitride of the embodiment of the present invention, an onium salt is used as a surface modifier for the inorganic nitride. In a case where the onium salt is adsorbed onto the surface of the inorganic nitride, the dispersibility of the obtained surface-modified inorganic nitride is improved. As a result, for example, the thermal conductivity of a material containing the surface-modified inorganic nitride is further improved.

As will be described later, in a case where the onium salt has a group represented by General Formula (1), a function of aligning a curable compound is imparted to the surface-modified inorganic nitride, and the thermal conductivity and the like are further improved. Particularly, in a case where the curable compound or a cured substance thereof exhibits liquid crystallinity, such characteristics are further improved. That is, in a case where the curable compound or a cured substance thereof exhibits liquid crystallinity, the curable compound or a cured substance thereof are aligned (vertical alignment) on the surface of the surface-modified inorganic nitride, and the aligned liquid crystal components are interposed between the surface-modified inorganic nitrides. Accordingly, the thermal conductivity between the surface-modified inorganic nitrides is further improved, and as a result, the overall thermal conductivity of the material is further improved.

The surface-modified inorganic nitride of the embodiment of the present invention contains an inorganic nitride and an onium salt adsorbed onto the surface of the inorganic nitride. In other words, the surface-modified inorganic nitride of the embodiment of the present invention is a surface-modified inorganic nitride obtained by modifying the surface of an inorganic nitride with an onium salt.

Hereinafter, the components contained in the surface-modified inorganic nitride will be specifically described, and then a method for manufacturing the surface-modified inorganic nitride, the use of the surface-modified inorganic nitride, and the like will be specifically described.

<Inorganic Nitride>

The type of the inorganic nitride is not particularly limited.

Examples of the inorganic nitride include boron nitride (BN), carbon nitride ($C_3N_4$), silicon nitride ($Si_3N_4$), gallium nitride (GaN), indium nitride (InN), aluminum nitride (AlN), chromium nitride ($Cr_2N$), copper nitride ($Cu_3N$), iron nitride ($Fe_4N$ or $Fe_3N$), lanthanum nitride (LaN), lithium nitride ($Li_3N$), magnesium nitride ($Mg_3N_2$), molybdenum nitride ($Mo_2N$), niobium nitride (NbN), tantalum nitride (TaN), titanium nitride (TiN), tungsten nitride ($W_2N$, $WN_2$, or WN), yttrium nitride (YN), zirconium nitride (ZrN), and the like.

The above inorganic nitrides may be used singly, or plural kinds thereof may be used in combination.

In view of further improving the thermal conductivity of the obtained surface-modified inorganic nitride, it is preferable that the inorganic nitride contains at least one kind of atom selected from the group consisting of a boron atom, an aluminum atom, and a silicon atom. More specifically, the inorganic nitride is more preferably at least one kind of nitride selected from the group consisting of aluminum nitride, boron nitride, and silicon nitride, and even more preferably boron nitride or aluminum nitride.

The shape of the inorganic nitride is not particularly limited, and the inorganic nitride may have a granule shape, a film shape, or a plate shape. In a case where the inorganic nitride has a granule shape, for example, the inorganic nitride may have a rice grain shape, a spherical shape, a cubical shape, a spindle shape, a scale shape, an aggregated shape, or an amorphous shape.

The size of the inorganic nitride is not particularly limited. However, in view of further improving the dispersibility of the surface-modified inorganic nitride, an average particle diameter of the inorganic nitride is preferably equal to or smaller than 500 µm, more preferably equal to or smaller than 200 µm, and even more preferably equal to or smaller than 100 µm. The lower limit of the size is not particularly limited. However, in view of handleability, the lower limit is preferably equal to or greater than 10 nm, and more preferably equal to or greater than 100 nm.

As a method for measuring the average particle diameter, 100 inorganic nitrides are randomly selected using an electron microscope, particle diameters (major axes) of the inorganic nitrides are measured, and the arithmetic mean thereof is calculated. In a case where a commercial product is used, the value listed in the catalog may be used.

<Onium Salt>

As described above, the onium salt is a component adsorbed onto the surface of the inorganic nitride.

The onium salt is a compound which is generated in a case where a compound having an electron pair not being involved in chemical bonding forms a coordinate bond with another cationic compound through the electron pair. Generally, the onium salt contains a cation and an anion.

Examples of the onium salt include a pyridinium salt, an imidazolium salt, a pyrrolidinium salt, a piperidinium salt, a triethylenediamine salt, an ammonium salt (primary to quaternary ammonium salts), a phosphonium salt, a sulfonium salt, a thiopyrylium salt, and the like. Among these, in view of further improving the dispersibility of the surface-modified inorganic nitride, a pyridinium salt, an imidazolium salt, a pyrrolidinium salt, a piperidinium salt, or a triethylenediamine salt is preferable, a pyridinium salt or an imidazolium salt is more preferable, and a pyridinium salt is even more preferable.

The pyridinium salt contains a pyridinium cation, the imidazolium salt contains an imidazolium cation, the pyrrolidinium salt contains a pyrrolidinium cation, the piperidinium salt contains a piperidinium cation, and the triethylenediamine salt contains a triethylenediamine cation.

The type of the anion contained in the onium salt is not particularly limited, and known anions are used. The valence of the anion is not particularly limited. Examples of the anion include monovalent to trivalent anions, and among these, monovalent and divalent anions are preferable.

Specifically, examples of the anion include $SO_4^{2-}$, $R_{A1}CO_3^-$, $R_{A2}SO_4^-$, $R_{A3}SO_3^-$, $PO_4^{3-}$, $R_{A4}PO_4^{2-}$, $(R_{A5})_2PO_4^-$, $PO_3^{3-}$, $R_{A6}PO_3^{2-}$, $(R_{A7})_2PO_3^-$, $[BF_4]^-$, $[B(CN)_4]^-$, $[B(C_6H_5)_4]^-$, $CN^-$, $OCN^-$, $SCN^-$, $[R_{A8}-COO]^-$, $[R_{A9}-SO_2)_2N]^-$, $[R_{A10}-CONSO_2-R_{A11}]^-$, $N(CN)_2^-$, $Cl^-$, $Br^-$, $I^-$, $PF_6^-$, $SbF_6^-$, $AsF_6^-$, $TsO^-$ (tosyl group), $L-(SO_3^-)_2$, and the like. Among these, $SO_4^{2-}$, $Cl^-$, $Br^-$, $I^-$, $R_{A3}SO_3^-$, $L-(SO_3^-)_2$, $PF_6^-$, or $TsO^-$ is preferable, and $SO_4^{2-}$, $Cl^-$, $Br^-$, or $I^-$ is more preferable.

$R_{A1}$ to $R_{A11}$ each independently represent a hydrogen atom or a hydrocarbon group which may have a substituent. The hydrocarbon group is not particularly limited, and examples thereof include an aliphatic hydrocarbon group, an aromatic hydrocarbon group, a group obtained by combining these, and the like.

The aliphatic hydrocarbon group may be any of linear, branched, and cyclic aliphatic hydrocarbon groups. The number of carbon atoms in the aliphatic hydrocarbon group is not particularly limited, but is preferably 1 to 12. Specific examples of the aliphatic hydrocarbon group include an alkyl group, an alkenyl group, an alkynyl group, and the like.

The number of carbon atoms in the aromatic hydrocarbon group is not particularly limited, but is preferably 6 to 18. Specific examples of the aromatic hydrocarbon group include an aryl group (a phenyl group, a tolyl group, a xylyl group, or the like), a naphthyl group, and the like.

It is preferable that $R_{A1}$ and $R_{A2}$ each represent a hydrogen atom or an alkyl group.

$R_{A3}$ is preferably an alkyl group (preferably having 1 to 12 carbon atoms) which may have a substituent or an aromatic hydrocarbon group (preferably having 6 to 18 carbon atoms) which may have a substituent.

It is preferable that $R_{A4}$ and $R_{A5}$ each independently represent a hydrogen atom or an alkyl group.

It is preferable that $R_{A6}$ and $R_{A7}$ each independently represent an aliphatic hydrocarbon group (preferably having 1 to 12 carbon atoms) which may have a substituent.

It is preferable that $R_{A8}$ represents a perfluoroalkyl group (linear or branched alkyl group in which all the hydrogen atoms are substituted with fluorine atoms).

$R_{A9}$ is preferably an alkyl group (preferably having 1 to 12 carbon atoms) which may have a substituent or an aryl group which may have a substituent, and more preferably a perfluoroalkyl group. Two $R_{A9}$'s may form a ring by being bonded to each other.

It is preferable that $R_{A10}$ and $R_{A11}$ each independently represent an aliphatic hydrocarbon group which may have a substituent. $R_{A10}$ and $R_{A11}$ may form a ring by being bonded to each other.

L represents an arylene group. Examples of the arylene group include a phenylene group, a naphthylene group, an anthracene group, and the like.

In view of further improving the dispersibility of the surface-modified inorganic nitride, it is preferable that the onium salt has a group represented by General Formula (1). In a case where the onium salt has the group represented by General Formula (1), and the curable compound or a cured substance thereof exhibits liquid crystallinity, the thermal conductivity of the obtained composition is further improved.

It is preferable that the cation in the onium salt has the group represented by General Formula (1).

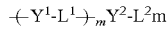  General Formula (1)

In General Formula (1), $Y^1$ and $Y^2$ each independently represent a divalent linking group having a 5-membered ring or a 6-membered ring that may have a substituent. $L^1$ and $L^2$ each independently represent a single bond or a divalent linking group. m represents an integer 1 to 5.

$Y^1$ and $Y^2$ each independently represent a divalent linking group having a 5-membered ring or a 6-membered ring that may have a substituent. It is preferable that $Y^1$ and $Y^2$ each independently represent a divalent linking group having a 6-membered ring that may have a substituent. The 5-membered ring or the 6-membered ring may be fused with another 5-membered ring or 6-membered ring.

The 5-membered ring and the 6-membered ring may be any of an aliphatic hydrocarbon ring, an aromatic hydrocarbon ring, and a heterocyclic ring.

Examples of the 6-membered aliphatic hydrocarbon ring include a cyclohexane ring, a cyclohexene ring, and a cyclohexadiene ring. Examples of the 6-membered aromatic hydrocarbon ring include a benzene ring. Examples of the 6-membered heterocyclic ring include a pyran ring, a dioxane ring, a dithiane ring, a thiin ring, a pyridine ring, a piperidine ring, an oxazine ring, a morpholine ring, a thiazine ring, a pyridazine ring, a pyrimidine ring, a pyrazine ring, a piperazine ring, and a triazine ring. Examples of the 5-membered heterocyclic ring include a thiophene ring, a thiazole ring, and an imidazole ring.

Examples of the substituent include those listed in the substituent group Y described above. More specifically, examples of the substituent include a halogen atom, a cyano group, an alkyl group having 1 to 12 carbon atoms, and an alkoxy group having 1 to 12 carbon atoms. The alkyl group and the alkoxy group may be substituted with an acyl group having 2 to 12 carbon atoms or an acyloxy group having 2 to 12 carbon atoms. As the substituent, an alkyl group having 1 to 12 carbon atoms (preferably having 1 to 6 carbon atoms and more preferably having 1 to 3 carbon atoms) is preferable. $Y^1$ and $Y^2$ may have two or more substituents. For example, in a case where $Y^1$ and $Y^2$ each represent a phenylene group, the phenylene group may be substituted with one to four alkyl groups having 1 to 12 carbon atoms (preferably having 1 to 6 carbon atoms and more preferably having 1 to 3 carbon atoms).

As $Y^1$ and $Y^2$, an unsubstituted or substituted phenylene group is preferable, and a phenylene group which is unsubstituted or substituted with an alkyl group having 1 to 12 carbon atoms (preferably having 1 to 6 carbon atoms and more preferably having 1 to 3 carbon atoms) is more preferable.

$L^1$ and $L^2$ each independently represent a single bond or a divalent linking group. The divalent linking group is not particularly limited, and examples thereof include —O—, —S—, —CO—, —C≡C—, —CH=CH—, —CH=N—, —N=CH—, —N=N—, —NR— (R represents a hydrogen atom or an alkyl group), a divalent hydrocarbon group (for example, an alkylene group or an arylene group), and a group obtained by combining these.

$L^1$ is preferably a single bond, —O—, —O—CO—, —CO—O—, —C≡C—, —CH=CH—, —CH=N—, —N=CH—, or —N=N—, and more preferably —O—CO— or —CO—O—.

In a case where m is equal to or greater than 2, a plurality of $L^1$'s even more preferably alternately represent —O—CO— or —CO—O—.

$L^2$ is preferably a single bond, —O—, —O—CO—, —CO—O—, —C≡C—, —CH=CH—, —CH=N—, —N=CH—, —N=N—, —O-AL-O—, —O-AL-O—CO—, —O-AL-CO—O—, —CO—O-AL-O—, —CO—O-AL-O—, —CO—O-AL-O—, —CO—O-AL-O—CO—, —CO—O-AL-CO—O—, —O—CO-AL-O—, —O—CO-AL-O—CO—, or —O—CO-AL-O—CO—O—. AL is an alkylene group having 1 to 10 carbon atoms. $L^2$ is more preferably a single bond, —O—, —O-AL-O—, —O-AL-O—CO—, —O-AL-CO—O—, —CO—O-AL-O—, —CO—O-AL-O—CO—, —CO—O-AL-CO—O—, —O—CO-AL-O—, —O—CO-AL-O—CO—, or —O—CO-AL-CO—O—, even more preferably a single bond or —O—, and particularly preferably —O—.

m represents an integer of 1 to 5. In view of further improving the dispersibility of the surface-modified inorganic nitride, m is preferably 1 or 2.

The onium salt may have a curable functional group. The curable functional group has the same definition as the curable functional group contained in the curable compound which will be described later. The curable functional group will be specifically described later.

In view of further improving the dispersibility of the surface-modified inorganic nitride, it is preferable that the onium salt has a group represented by General Formula (2). It is preferable that the cation in the onium salt has the group represented by General Formula (2).

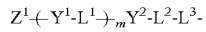  General Formula (2)

In General Formula (2), each of $Y^1$, $Y^2$, $L^1$, $L^2$, and m has the same definition as each of $Y^1$, $Y^2$, $L^1$, $L^2$, and m in General Formula (1).

In General Formula (2), $Z^1$ represents a substituent. Examples of the substituent include the groups exemplified above in the substituent group Y. Among these, as the substituent, for example, an alkyl group which may have a substituent, an alkenyl group which may have a substituent, an aryl group which may have a substituent, an alkoxy group which may have a substituent, an alkoxycarbonyl group which may have a substituent, an aryloxycarbonyl group which may have a substituent, an arylcarbonyloxy group which may have a substituent, a halogen atom, a cyano group, or a curable functional group is preferable. The curable functional group has the same definition as the curable functional group contained in the curable compound which will be described later. The curable functional group will be specifically described later.

Specific examples of $Z^1$ include a phenyl group substituted with a halogen atom, a phenyl group substituted with a nitro group, a phenyl group substituted with a cyano group, a phenyl group substituted with an alkyl group having 1 to 10 carbon atoms, a phenyl group substituted with an alkoxy group having 2 to 20 carbon atoms, an alkyl group having 1 to 12 carbon atoms, an alkynyl group having 2 to 20 carbon atoms, an alkoxy group having 1 to 20 carbon atoms, an alkoxycarbonyl group having 2 to 13 carbon atoms, an aryloxycarbonyl group having 7 to 26 carbon atoms, an arylcarbonyloxy group having 7 to 26 carbon atoms, an amino group, a thiol group, a hydroxyl group, an isocyanate group, a carboxyl group, a carboxylic acid anhydride group, an oxetanyl group, an oxiranyl group, a (meth)acryloyl group, and the like.

As $Z^1$, an alkyl group having 1 to 12 carbon atoms, an alkoxy group having 1 to 20 carbon atoms, or an alkoxycarbonyl group having 2 to 13 carbon atoms is preferable.

In General Formula (2), $L^3$ represents a divalent aliphatic hydrocarbon group or a divalent aromatic hydrocarbon group. Examples of the divalent aliphatic hydrocarbon group include an alkylene group, an alkenylene group, and an alkynylene group. Among these, an alkylene group is preferable.

The divalent aliphatic hydrocarbon group may be any of linear, branched, and cyclic aliphatic hydrocarbon groups. Among these, a linear aliphatic hydrocarbon group is preferable.

The number of carbon atoms contained in the divalent aliphatic hydrocarbon group is not particularly limited, but is preferably 1 to 20, more preferably 1 to 10, even more preferably 1 to 5, and particularly preferably 1 or 2.

As a suitable aspect of the onium salt, a compound represented by General Formula (3) can be exemplified.

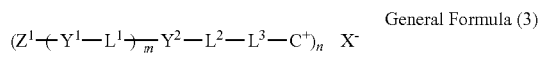
General Formula (3)

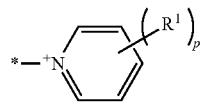
General Formula (4)

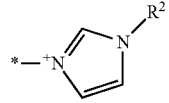
General Formula (5)

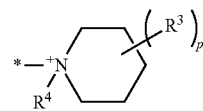
General Formula (6)

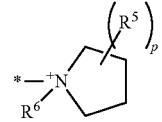
General Formula (7)

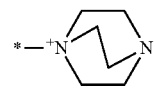
General Formula (8)

In General Formula (3), each of $Y^1$, $Y^2$, $L^1$, $L^2$, and m has the same definition as each of $Y^1$, $Y^2$, $L^1$, $L^2$, and in in General Formula (1).

In General Formula (3), each of $Z^1$ and $L^3$ has the same definition as each of $Z^1$ and $L^3$ in General Formula (2).

In General Formula (3), $X^-$ represents an n-valent anion. Examples of the n-valent anion include monovalent to trivalent anions. Among these, a monovalent or divalent anion is preferable, and a monovalent anion is more preferable. Specific examples of the anion include the anions described above.

In General Formula (3), n represents an integer of 1 to 3. n is preferably 1 or 2, and more preferably 1.

In General Formula (3), $C^+$ represents a group selected from the group consisting of a group (cationic group) represented by General Formula (4) to a group (cationic group) represented by General Formula (8). Among these, the group represented by General Formula (4) is preferable.

* in each general formula represents a position bonded to $L^3$ in General Formula (3).

In General Formula (4), $R^1$ represents a substituent. The type of the substituent is not particularly limited, and examples thereof include the groups exemplified above in the substituent group Y. Among these, an unsubstituted amino group or a substituted amino group is preferable as $R^1$. As the substituted amino group, a substituted amino group having 1 to 20 carbon atoms is preferable. Furthermore, as the substituted amino group, a dialkyl-substituted amino group is preferable.

In a case where $R^1$ is a dialkyl-substituted amino group, two alkyl groups may form a nitrogen-containing heterocyclic ring by being bonded to each other. The nitrogen-containing heterocyclic ring formed at this time is preferably a 5-membered ring or a 6-membered ring.

$R^1$ is more preferably an unsubstituted amino group or a dialkyl-substituted amino group having 2 to 12 carbon atoms, and even more preferably an unsubstituted amino group or a dialkyl-substituted amino group having 2 to 8 carbon atoms.

In a case where $R^1$ is an unsubstituted amino group and a substituted amino group, it is preferable that position 4 of the pyridinium ring is substituted.

In General Formula (5), $R^2$ represents a substituent. The type of the substituent is not particularly limited, and examples thereof include the groups exemplified above in the substituent group Y. The substituent may be further substituted with a substituent.

$R^2$ is preferably an alkyl group which may have a substituent or an aryl group which may have a substituent.

In General Formula (6), $R^3$ and $R^4$ each independently represent a substituent. The type of the substituent is not particularly limited, and examples thereof include the groups exemplified above in the substituent group Y. The substituent may be further substituted with a substituent.

$R^3$ is preferably a hydroxyl group.

$R^4$ is preferably an alkyl group.

In General Formula (7), $R^5$ and $R^6$ each independently represent a substituent. The type of the substituent is not particularly limited, and examples thereof include the groups exemplified above in the substituent group Y. The substituent may be further substituted with a substituent.

$R^5$ is preferably a hydroxyl group.

$R^6$ is preferably an alkyl group.

In General Formula (4), General Formula (6), and General Formula (7), p represents an integer of 0 to 4. In view of further improving the dispersibility of the surface-modified inorganic nitride, p is preferably an integer of 1 to 3, more preferably 1 or 2, and even more preferably 1.

As the most suitable aspect of the onium salt, a compound represented by General Formula (9) can be exemplified.

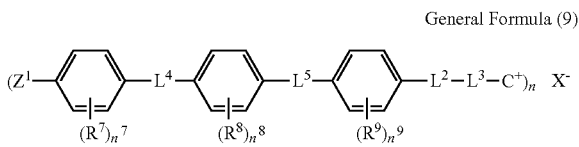

General Formula (9)

In General Formula (9), each of $Z^1$, $L^2$, $L^3$, n, $X^-$, and $C^+$ has the same definition as each of $Z^1$, $L^2$, $L^3$, n, $X^-$, and $C^+$ in General Formula (3).

In General Formula (9), $L^4$ and $L^5$ each represent a single bond or a divalent linking group. The divalent linking group has the same definition as the divalent linking group represented by $L^1$ and $L^2$ described above.

As $L^4$ and $L^5$, —O—CO— or —CO—O— is preferable. It is preferable that $L^4$ is —CO—O— and $L^5$ is —O—CO—.

$R^7$, $R^8$, and $R^9$ each independently represent an alkyl group having 1 to 12 carbon atoms (preferably having 1 to 6 carbon atoms, and more preferably having 1 to 3 carbon atoms). $n^7$ represents an integer of 0 to 4. $n^8$ represents an integer of 1 to 4. $n^9$ represents an integer of 0 to 4. It is preferable that $n^7$ and $n^9$ each represent 0 and $n^8$ represents an integer of 1 to 4 (preferably 1 to 3).

Hitherto, suitable aspects of the onium salt have been described, but the onium salt is not limited to the aspects. For example, the onium salt may be a compound represented by the following General Formula (10).

General Formula (10)

In General Formula (10), each of n, $X^-$, and $C^+$ has the same definition as each of n, $X^-$, and $C^+$ in General Formula (3) described above.

$R_B$ represents an alkyl group which may have a substituent or an aryl group which may have a substituent.

Specifically, examples of the onium salt include the following ones.

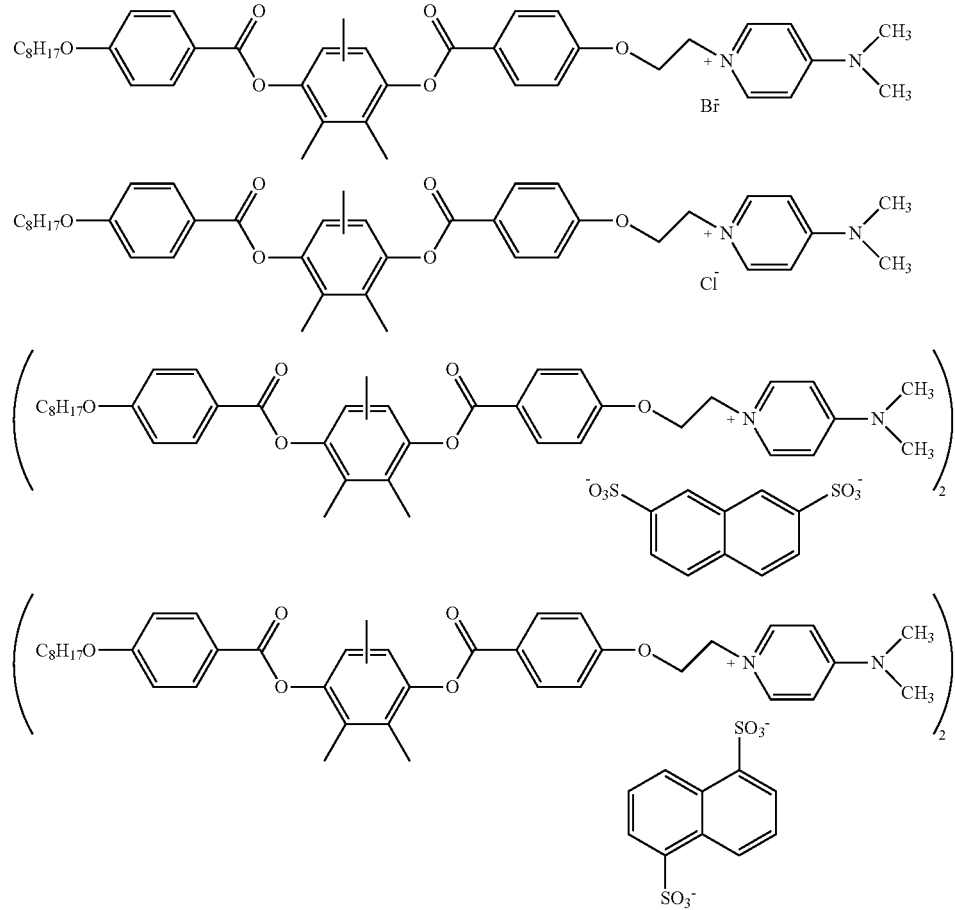

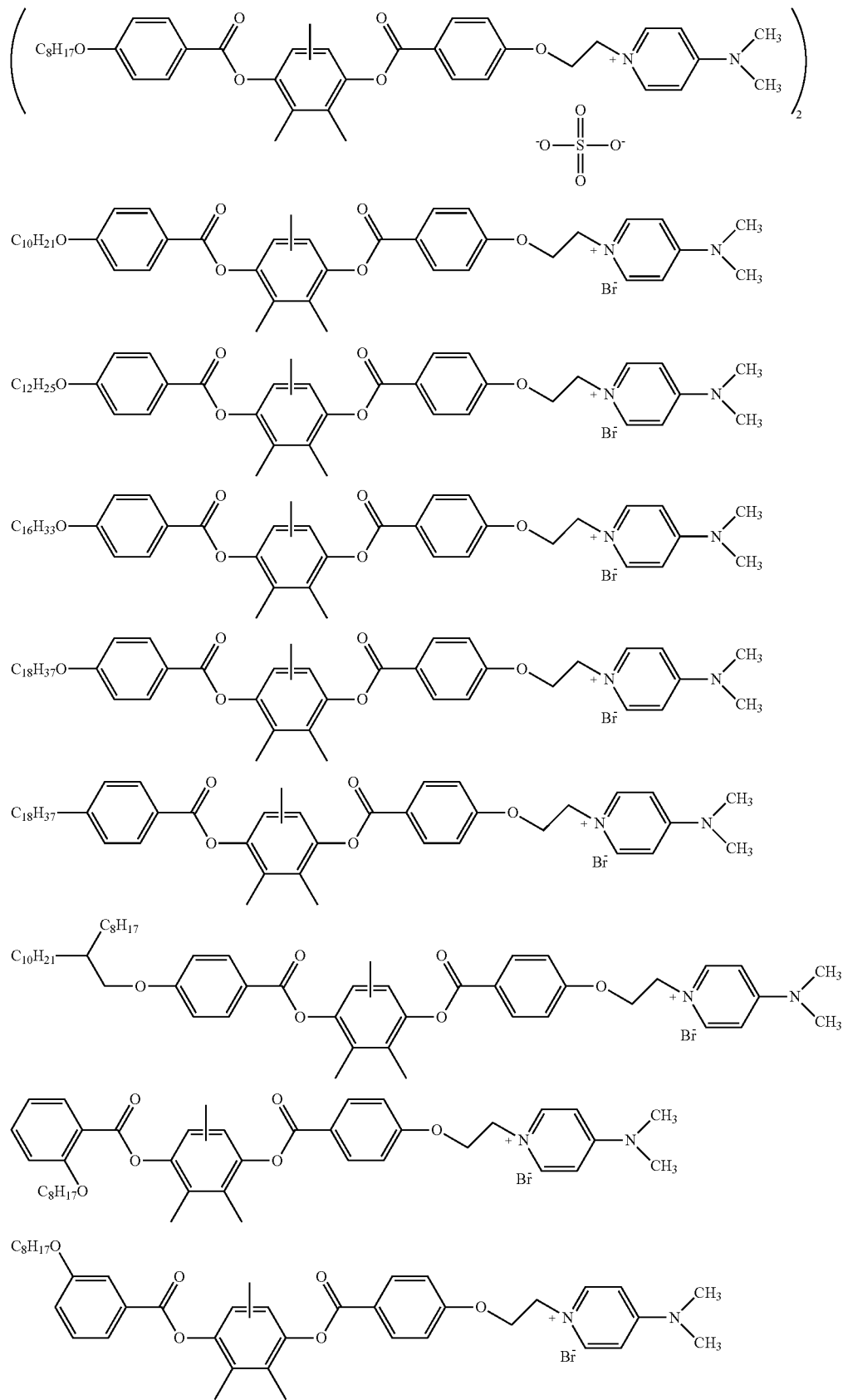

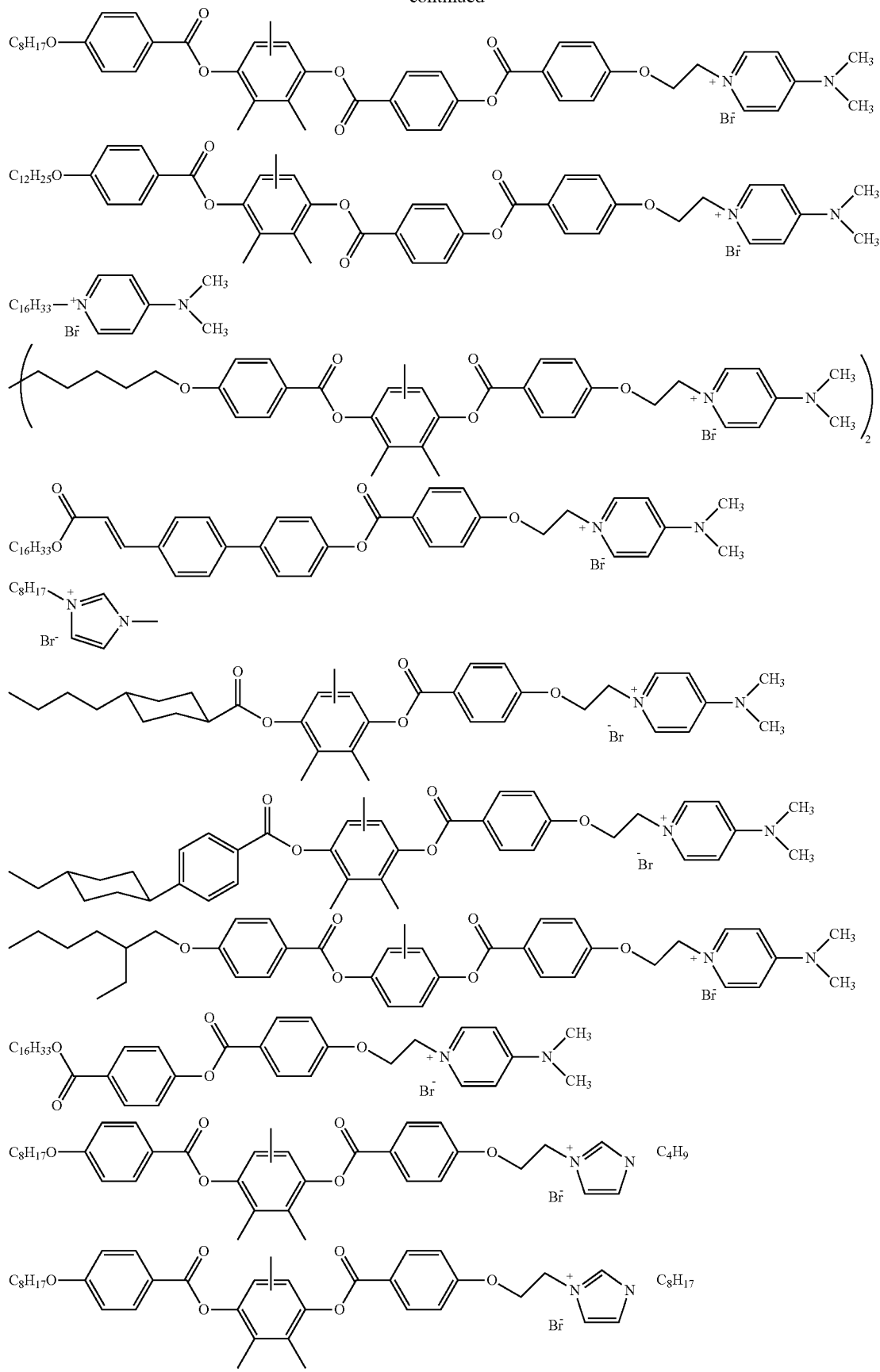

-continued
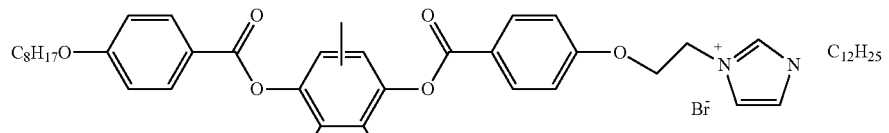
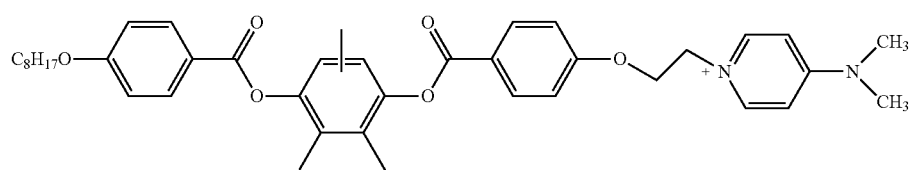
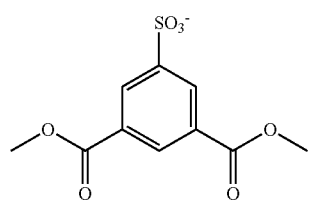
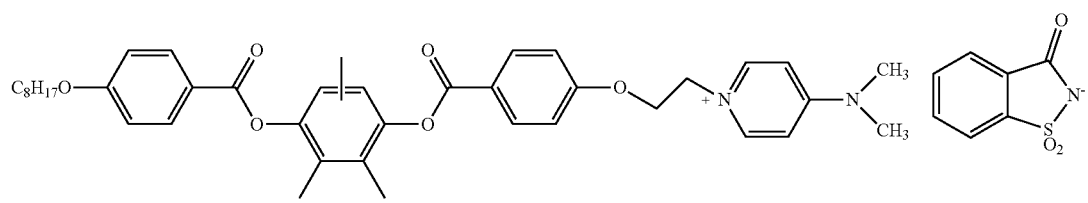
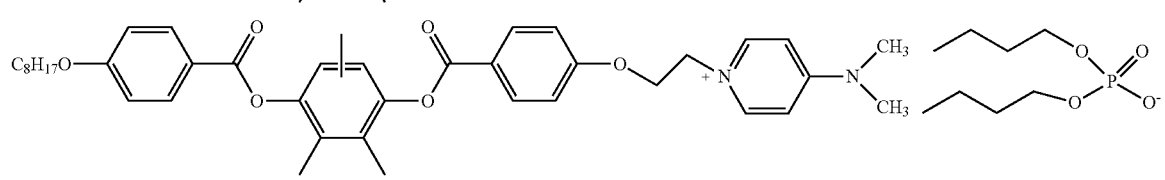
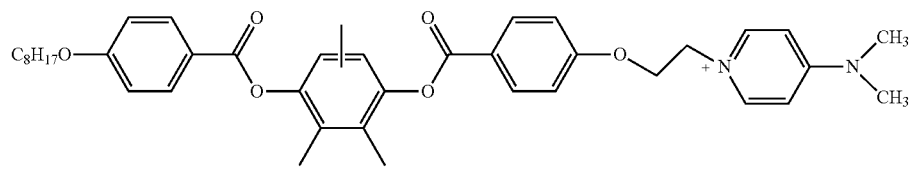
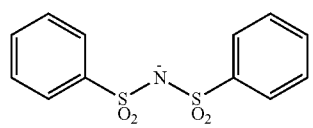
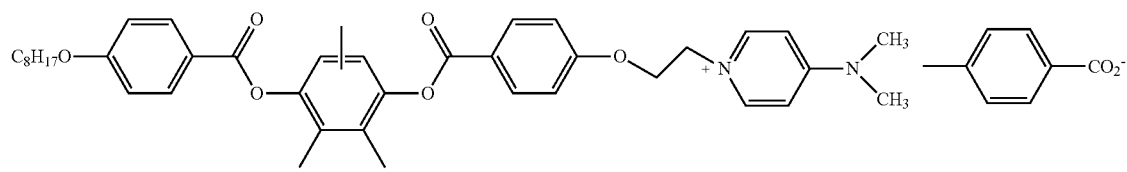
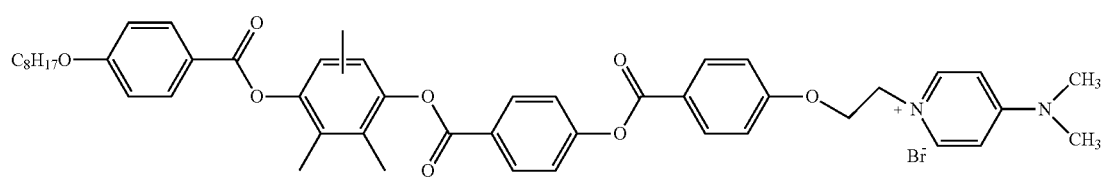
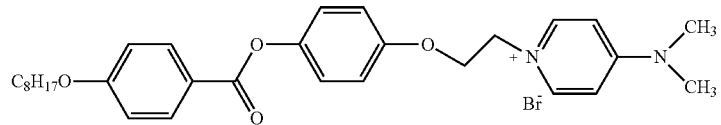

-continued
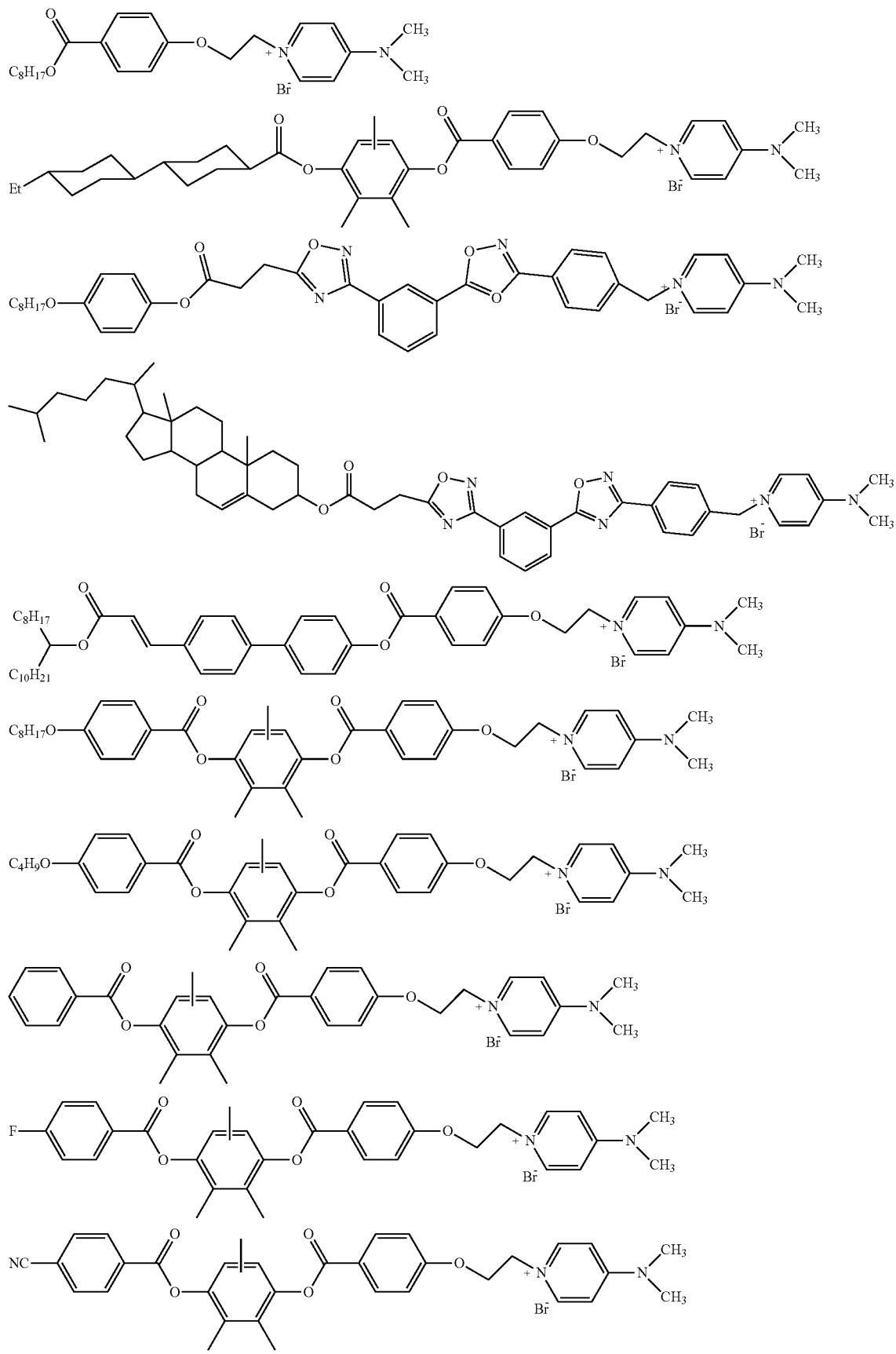

-continued
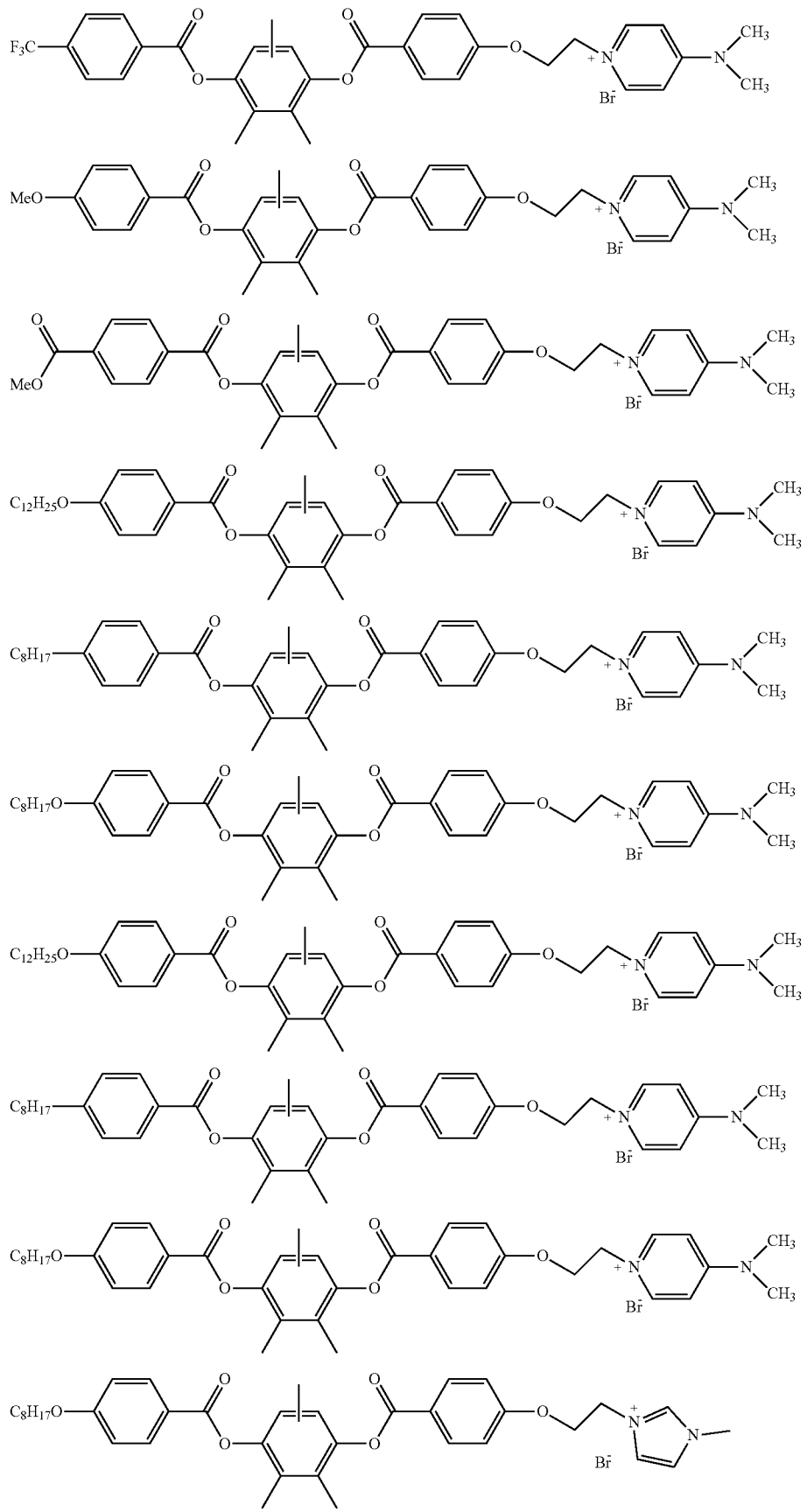

-continued
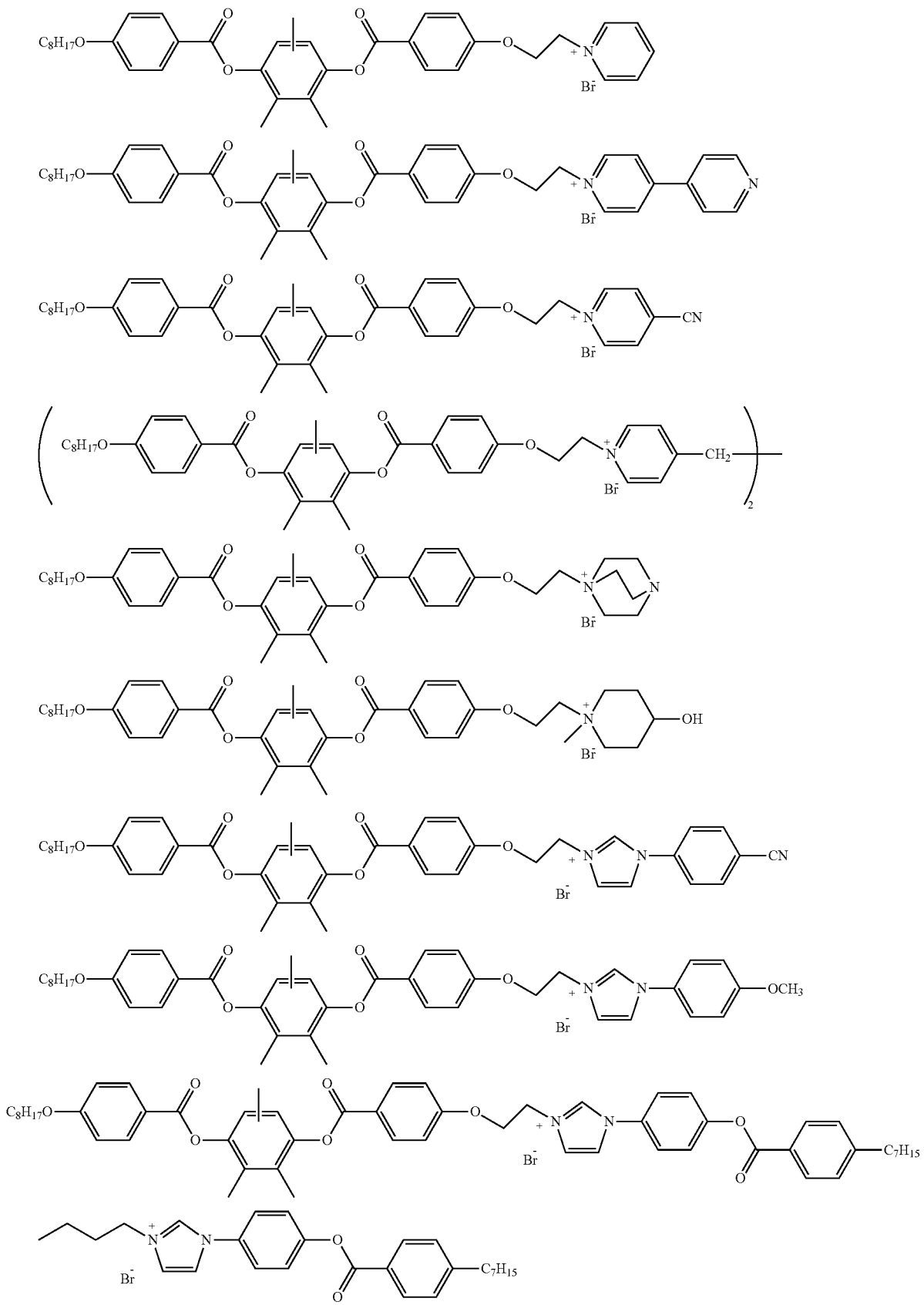

-continued

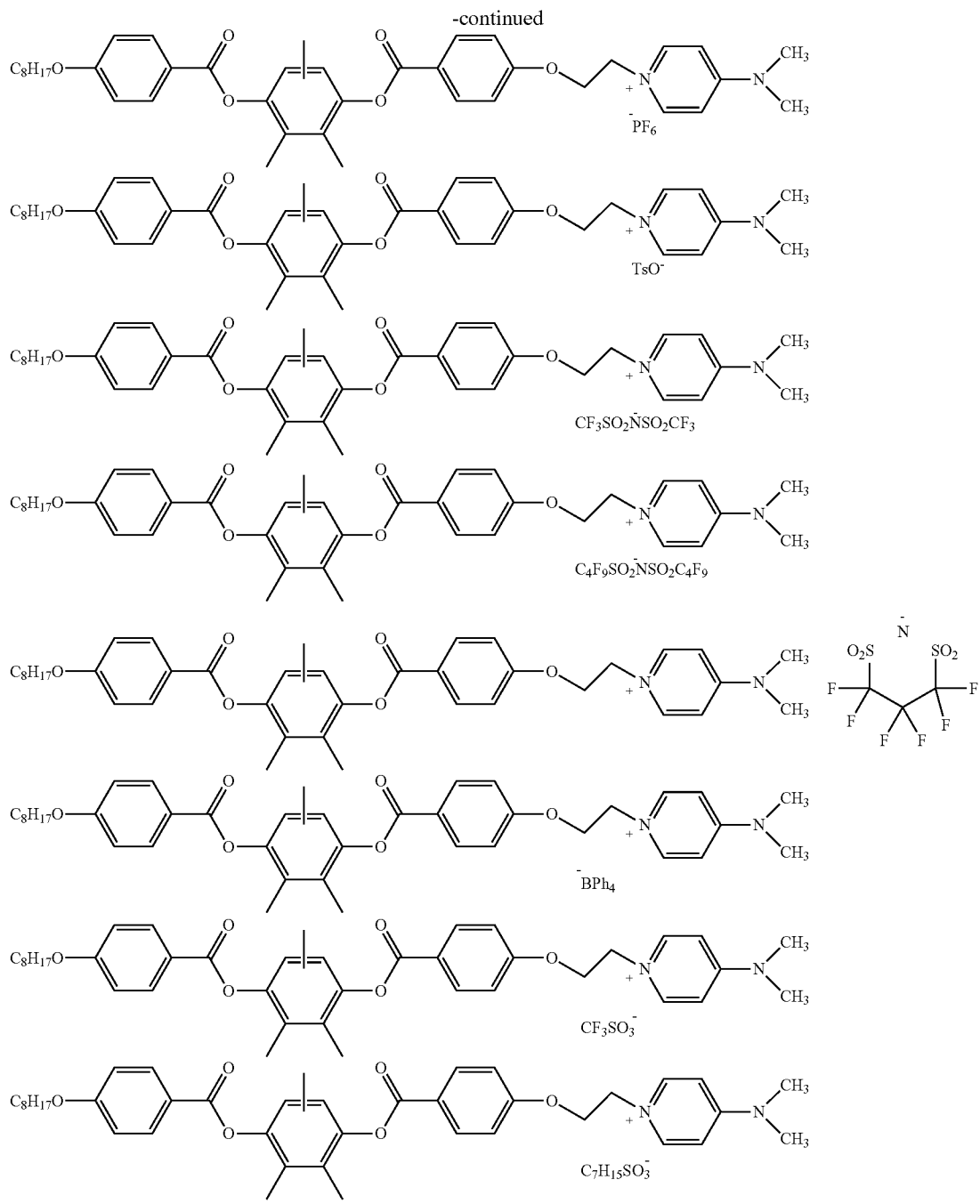

The onium salt can be synthesized by known methods.

<Method for Manufacturing Surface-Modified Inorganic Nitride>

The method for manufacturing the surface-modified inorganic nitride is not particularly limited, and examples thereof include a method including a step of bringing an inorganic nitride into contact with an onium salt.

The inorganic nitride and the onium salt are brought into contact with each other, for example, by stirring a solution containing the inorganic nitride and the onium salt.

The type of a solvent of the solution is not particularly limited, but an organic solvent is preferable. Examples of the organic solvent include ethyl acetate, methyl ethyl ketone, dichloromethane, and tetrahydrofuran.

The solution may contain other components such as the curable compound which will be described later. In this case, the obtained mixture can also be used as the composition which will be described later.

The mixing ratio between the inorganic nitride and the onium salt may be determined in consideration of the structure and surface area of the inorganic nitride and the molecular structure of the molecule of the onium salt such as an aspect ratio.

The stirring conditions (a rotation speed for stirring and a temperature condition) are not particularly limited.

<Surface-Modified Inorganic Nitride>

In the surface-modified inorganic nitride, the onium salt modifies the surface of the inorganic nitride. It is preferable that the onium salt modifies the surface of the inorganic nitride by forming a bond such as a hydrogen bond with the inorganic nitride.

The shape of the surface-modified inorganic nitride is not particularly limited, and the surface-modified inorganic nitride may have a granule shape, a film shape, or a plate shape.

In the surface-modified inorganic nitride, a mass ratio between the onium salt and the inorganic nitride (mass of onium salt/mass of inorganic nitride) is not particularly limited. In view of further improving the dispersibility of the surface-modified inorganic nitride, the mass ratio is preferably 0.0001 to 0.5, and more preferably 0.0005 to 0.1.

In the surface-modified inorganic nitride, the onium salt may be adsorbed onto the surface of the inorganic nitride, or another surface modifier may be adsorbed onto the surface of the inorganic nitride. That is, the surface-modified inorganic nitride may contain the inorganic nitride and the onium salt and another surface modifier which are adsorbed onto the surface of the inorganic nitride.

Examples of preferable another surface modifier include an aldehyde compound and a boronic acid compound, and these compounds are also easily adsorbed onto the surface of the inorganic nitride. In a case where these compounds are used in combination with the onium salt, the dispersibility of the surface-modified inorganic nitride is further improved.

The aldehyde compound may have an aldehyde group, and examples thereof include a compound represented by the following General Formula (A).

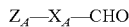

$Z_A$—$X_A$—CHO            General Formula (A)

$Z_A$ represents a hydrogen atom or a curable functional group, and $X_A$ represents a divalent linking group.

The curable functional group has the same definition as the curable functional group contained in the curable compound which will be described later. The curable functional group will be specifically described later.

The divalent linking group is not particularly limited, and examples thereof include —O—, —S—, —CO—, —C≡C—, —CH=CH—, —CH=N—, —N=CH—, —N=N—, —NR— (R represents a hydrogen atom or an alkyl group), a divalent hydrocarbon group (for example, an alkylene group or an arylene group), and a group obtained by combining these. As $X_A$, a linking group containing a phenylene group which may have at least one substituent is preferable.

The boronic acid compound has a structure in which one or more hydroxyl groups of boric acid are substituted with an organic group such as a hydrocarbon group. The boronic acid compound may be a compound represented by the following General Formula (B).

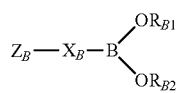

General Formula (B)

In General Formula (B), $Z_B$ represents a curable functional group, a hydrogen atom, a halogen atom, a quaternary ammonium group or a salt thereof, or a quaternary pyridinium group or a salt thereof. The quaternary pyridinium group may have a substituent. The curable functional group has the same definition as the curable functional group contained in the curable compound which will be described later. The curable functional group will be specifically described later.

$X_B$ represents a divalent linking group. The divalent linking group is not particularly limited, and examples thereof include —O—, —S—, —CO—, —C≡C—, —CH=CH—, —CH=N—, —N=CH—, —N=N—, —NR— (R represents a hydrogen atom or an alkyl group), a divalent hydrocarbon group (for example, an alkylene group or an arylene group), and a group obtained by combining these. As X, a linking group containing a phenylene group which may have at least one substituent is preferable.

$R_{B1}$ and $R_{B2}$ each independently represent a hydrogen atom, an aliphatic hydrocarbon group which may have a substituent, an aryl group which may have a substituent, or a heteroaryl group which may have a substituent.

$R_{B1}$ and $R_{B2}$ may be linked to each other through an alkylene linking group, an arylene linking group, or a linking group obtained by combining these.

<Composition>

The surface-modified inorganic nitride exhibits improved dispersibility in various materials. By exploiting these characteristics, the surface-modified inorganic nitride can be used as a composition for various uses by being mixed with other materials.

The content of the surface-modified inorganic nitride in the composition is not particularly limited, and according to the use of the composition, optimal content is appropriately selected. Particularly, in view of allowing the characteristics of the surface-modified inorganic nitride to be more markedly exhibited, the content of the surface-modified inorganic nitride with respect to the total solid content in the composition is preferably 0.01% to 20% by mass, and more preferably 0.05% to 10% by mass.

The composition may contain one kind of surface-modified inorganic nitride or two or more kinds of surface-modified inorganic nitrides.

As described above, the composition may contain materials other than the surface-modified inorganic nitride. Examples of the materials include a curable compound, a curing agent, a curing accelerator, a polymerization initiator, and the like.

Hereinafter, various components will be specifically described.

(Curable Compound)

The curable compound is a compound cured by a predetermined treatment using heat, light, or the like.

The curable compound has a curable functional group. Examples of the curable functional group include an oxiranyl group, an oxetanyl group, a (meth)acryloyl group, a vinyl group, an allyl group, an isocyanate group, a hydroxyl group, a thiol group, an amino group, a carboxyl group, a carboxylic acid anhydride group, and the like. Among these, in view of excellent reactivity, an oxiranyl group, an oxetanyl group, or a (meth)acryloyl group is preferable.

The number of curable functional groups contained in the curable compound is not particularly limited. However, in view of further improving the heat resistance of a cured substance obtained by curing the composition, the number of curable functional groups in the curable compound is preferably equal to or greater than 2, and more preferably equal to or greater than 3. The upper limit thereof is not particularly limited, but is equal to or smaller than 8 in many cases.

The type of the curable compound is not particularly limited, and known curable compounds can be used.

Examples of the curable compound include the epoxy resin monomer and the acryl resin monomer described in paragraph "0028" in JP4118691B, the epoxy compound described in paragraphs "0006" to "0011" in JP2008-013759A, the epoxy resin mixture described in paragraphs "0032" to "0100" in JP2013-227451A, and the like.

The content of the curable compound in the composition is not particularly limited, and according to the use of the composition, optimal content is appropriately selected. Particularly, the content of the curable compound with respect to the total solid content in the composition is preferably 10% to 90% by mass, more preferably 15% to 70% by mass, and even more preferably 20% to 60% by mass.

The composition may contain one kind of curable compound or two or more kinds of curable compounds.

It is preferable that the curable compound exhibits liquid crystallinity. That is, the curable compound is preferably a liquid crystal compound. In other words, the curable compound is preferably a liquid crystal compound having a curable functional group.

It is also preferable that a cured substance of the curable compound exhibits liquid crystallinity. The cured substance of the curable compound means a cured substance obtained by curing the curable compound, and is not included in the aforementioned surface-modified inorganic nitride. If necessary, for obtaining the cured substance, the curing agent which will be described later may be used.

As described above, it is preferable that the curable compound or a cured substance thereof exhibits liquid crystallinity. That is, the curable compound or a cured substance thereof is preferably a liquid crystal component.

The curable compound may be any of a rod-like liquid crystal compound or a disk-like liquid crystal compound. That is, the curable compound may be any of a rod-like liquid crystal compound having a curable functional group and a disk-like liquid crystal compound having a curable functional group.

Hereinafter, the rod-like liquid crystal compound and the disk-like liquid crystal compound will be specifically described.

(Rod-Like Liquid Crystal Compound)

As the rod-like liquid crystal compound, azomethines, azoxies, cyanobiphenyls, cyanophenyl esters, benzoic acid esters, cyclohexane carboxylic acid phenyl esters, cyanophenyl cyclohexanes, cyano-substituted phenylpyrimidines, alkoxy-substituted phenylpyrimidines, phenyldioxanes, tolans, and alkenylcyclohexyl benzonitriles are preferable. In addition to these low-molecular weight liquid crystal compounds, high-molecular weight liquid crystal compounds can also be used. The aforementioned high-molecular weight liquid crystal compounds are polymer compounds obtained by polymerizing rod-like liquid crystal compounds having a low-molecular weight reactive group.

Examples of preferable rod-like liquid crystal compounds include a rod-like liquid crystal compound represented by the following General Formula (XXI).

$Q^1\text{-}L^{111}\text{-}A^{111}\text{-}L^{113}\text{-}M\text{-}L^{114}\text{-}A^{112}\text{-}L^{112}Q^2$    General Formula (XXI):

In the formula, $Q^1$ and $Q^2$ each independently represent a curable functional group, and $L^{111}$, $L^{112}$, $L^{113}$, and $L^{114}$ each independently represent a single bond or a divalent linking group. $A^{111}$ and $A^{112}$ each independently represent a divalent linking group (spacer group) having 1 to 20 carbon atoms. M represents a mesogenic group.

The definition of the curable functional group is as described above.

At least one of $Q^1$ or $Q^2$ preferably represents an oxiranyl group, and both of $Q^1$ and $Q^2$ more preferably represent an oxiranyl group.

As the divalent linking group represented by $L^{111}$, $L^{112}$, $L^{113}$, and $L^{114}$, a divalent linking group is preferable which is selected from the group consisting of —O—, —S—, —CO—, -NR$^{112}$—, —CO—O—, —O—CO—O—, —CO—NR$^{112}$, —NR$^{112}$—CO—, —O—CO—, —CH$_2$—O—, —O—CH$_2$—, —O—CO—NR$^{112}$—, —NR$^{112}$—CO—O—, and NR$^{112}$—CO—NR$^{112}$—, R$^{112}$ is an alkyl group having 1 to 7 carbon atoms or a hydrogen atom.

$A^{111}$ and $A^{112}$ each represent a divalent linking group having 1 to 20 carbon atoms. Particularly, $A^{111}$ and $A^{112}$ preferably each represent an alkylene group having 1 to 12 carbon atoms, an alkenylene group having 1 to 12 carbon atoms, or an alkynylene group having 1 to 12 carbon atoms, and more preferably each represent an alkylene group having 1 to 12 carbon atoms.

The divalent linking group is preferably linear and may contain oxygen atoms or sulfur atoms that are not adjacent to each other. Furthermore, the divalent linking group may have a substituent, and examples of the substituent include a halogen atom (a fluorine atom, a chlorine atom, or a bromine atom), a cyano group, a methyl group, and an ethyl group.

Examples of the mesogenic group represented by M include known mesogenic groups. Particularly, a group represented by the following General Formula (XXII) is preferable.

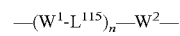    General Formula (XXII):

In the formula, $W^1$ and $W^2$ each independently represent a divalent cyclic alkylene group or a divalent cyclic alkenylene group, an arylene group, or a divalent heterocyclic group, and $L^{115}$ represents a single bond or a divalent linking group. n represents 1, 2, or 3.

Examples of $W^1$ and $W^2$ include 1,4-cyclohexanediyl, 1,4-phenylene, pyrimidine-2,5-diyl, pyridine-2,5-diyl, 1,3,4-thiadiazole-2,5-diyl, 1,3,4-oxadiaole-2,5-diyl, naphthalene-2,6-diyl, naphthalene-1,5-diyl, thiophene-2,5-diyl, and pyridazine-3,6-diyl. In a case where $W^1$ and $W^2$ each represent 1,4-cyclohexanediyl, the compound may any of constitutional isomers of a trans-isomer and a cis-isomer, or a mixture in which the isomers are mixed at any ratio. Among these, a trans-isomer is preferable.

Each of $W^1$ and $W^2$ may have a substituent. Examples of the substituent include groups exemplified above in the substituent group Y. More specifically, examples of the substituent include a halogen atom (a fluorine atom, a chlorine atom, a bromine atom, and an iodine atom), a cyano group, an alkyl group having 1 to 10 carbon atoms (for example, a methyl group, an ethyl group, a propyl group, or the like), an alkoxy group having 1 to 10 carbon atoms (for example, a methoxy group, an ethoxy group, or the like), an acyl group having 1 to 10 carbon atoms (for example, a formyl group, an acetyl group, or the like), an alkoxycarbonyl group having 1 to 10 carbon atoms (for example, a methoxycarbonyl group, an ethoxycarbonyl group, or the like), an acyloxy group having 1 to 10 carbon atoms (for example, an acetyloxy group, a propionyloxy group, or the like), a nitro group, a trifluoromethyl group, a difluoromethyl group, and the like.

Examples of the divalent linking group represented by $L^{115}$ include the specific examples of the divalent linking group represented by $L^{111}$ to $L^{114}$ described above, such as 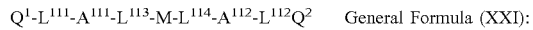
—O—CH$_2$—.

Examples of those preferable as the basic skeleton of the mesogenic group represented by General Formula (XXII) will be shown below, and these may be substituted with the aforementioned substituent.

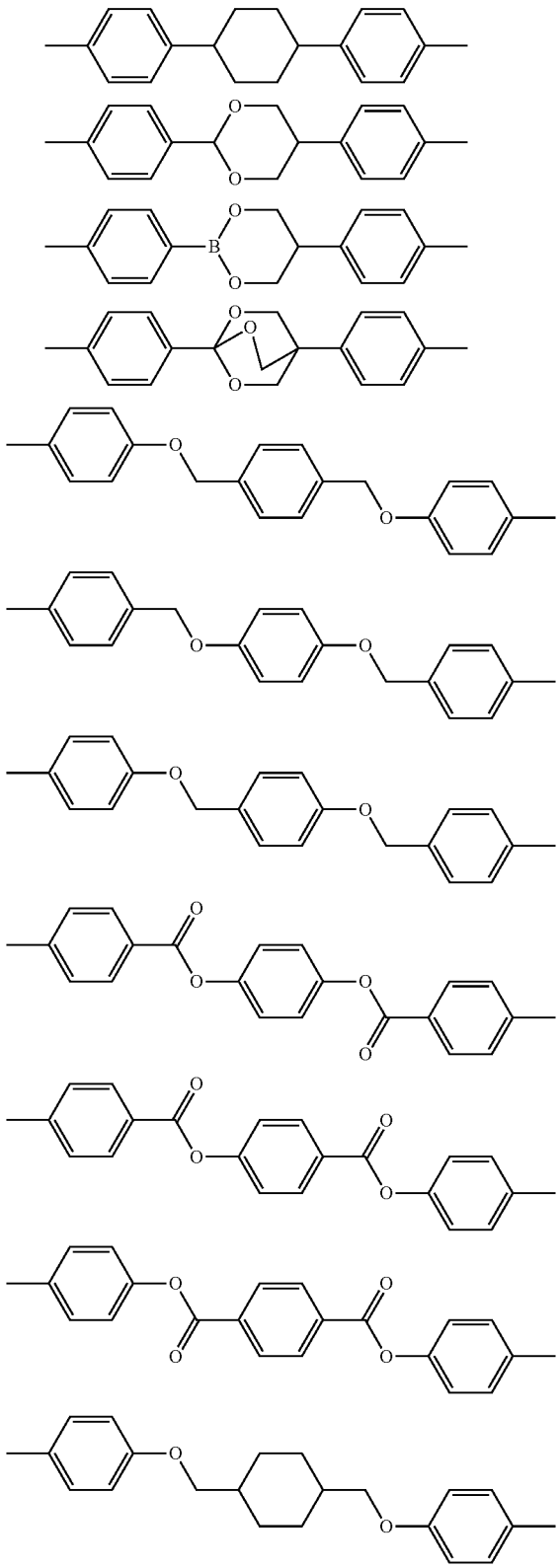

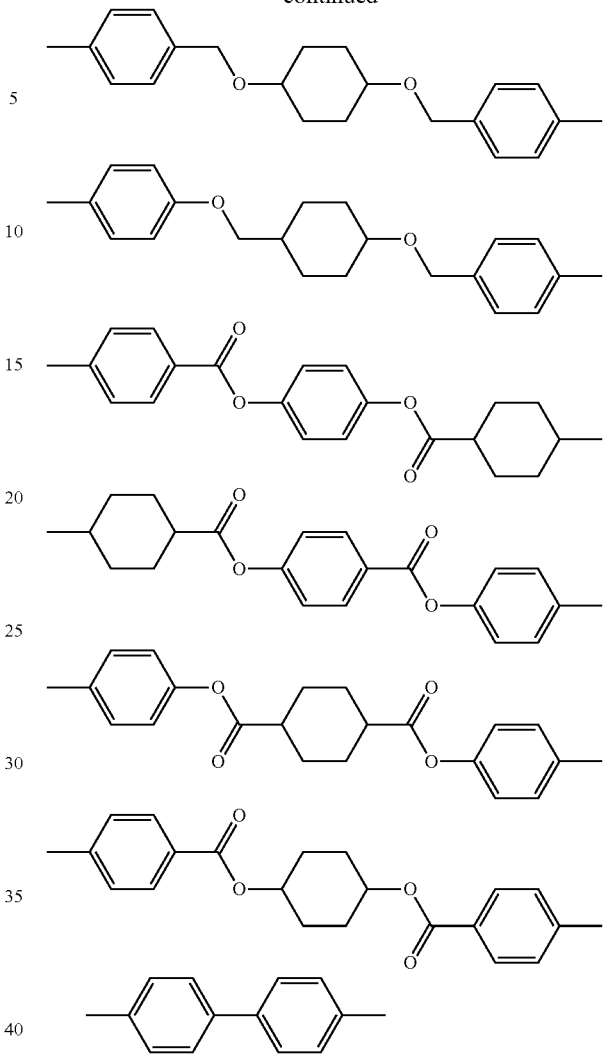

The compound represented by General Formula (XXI) can be synthesized with reference to the method described in JP1999-513019A (JP-H11-513019A) (WO97/000600).

The rod-like liquid crystal compound may be a monomer having the mesogenic group described in JP1999-323162A (JP-H11-323162A) and JP4118691B.

(Disk-Like Liquid Crystal Compound)

The disk-like liquid crystal compound has a disk-like structure in at least a portion thereof. The disk-like structure refers has at least an aromatic ring. Therefore, the disk-like liquid crystal compound can form a columnar structure by forming a stacking structure based on the intermolecular π-π interaction.

Specific examples of the disk-like structure include the triphenylene structure described in Angew. Chem. Int. Ed. 2012, 51, 7990-7993 or JP1995-306317A (JP-H07-306317A), the trisubstituted benzene structure described in JP2007-002220A or JP2010-244038A, and the like.

The inventors of the present invention have found that in a case where the disk-like liquid crystal compound is used as a curable compound, a thermally conductive material showing high thermal conductivity is obtained. According to the inventors, the reason is as below. While the rod-like liquid crystal compound can only linearly (one-dimensionally) conduct heat, the disk-like liquid crystal compound can flatwise (two-dimensionally) conduct heat in a normal direction, and accordingly, the number of heat conduction paths increase, and the thermal conductivity is improved.

Furthermore, in a case where the disk-like liquid crystal compound is used, the heat resistance of the cured substance of the composition is further improved.

It is preferable that disk-like liquid crystal compound has three or more curable functional groups. The cured substance of the composition containing the disk-like liquid crystal compound having three or more curable functional groups tends to have a high glass transition temperature and high heat resistance. Compared to a rod-like liquid crystal compound, the disk-like liquid crystal compound more likely to have three or more curable functional groups without affecting the characteristics of a mesogenic portion. The number of curable functional groups contained in the disk-like liquid crystal compound is preferably equal to or smaller than 8, and more preferably equal to or smaller than 6. It is preferable that all the curable functional groups are oxiranyl groups.

As the disk-like liquid crystal compound, a compound represented by the following General Formula (XI) or a compound represented by the following General Formula (XII) is preferable.

General Formula (XI)

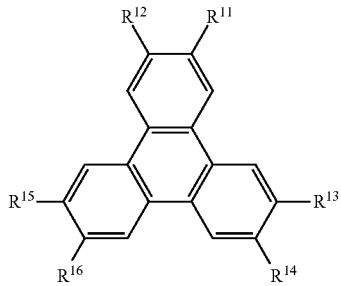

In the formula, $R^{11}$, $R^{12}$, $R^{13}$, $R^{14}$, $R^{15}$, and $R^{16}$ each independently represent *—$X^{11}$-$L^{11}$-$P^{11}$ or *—$X^{12}$—$Y^{12}$, * represents a positon bonded to a triphenylene ring, two or more among $R^{11}$, $R^{12}$, $R^{13}$, $R^{14}$, $R^{15}$, and $R^{16}$ represent *—$X^{11}$-$L^{11}$-$P^{11}$, $X^{11}$ and $X^{12}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $L^{11}$ represents a divalent linking group or a single bond, $P^{11}$ represents a curable functional group, $Y^{12}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—.

It is preferable that three or more out of $R^{11}$, $R^{12}$, $R^{13}$, $R^{14}$, $R^{15}$, and $R^{16}$ represent *—$X^{11}$-$L^{11}$-$P^{11}$. Particularly, it is more preferable that any one or more out of $R^{11}$ and $R^{12}$, any one or more out of $R^{13}$ and $R^{14}$, and any one or more out of $R^{15}$ and $R^{16}$ represent *—$X^{11}$-$L^{11}$-$P^{11}$. It is even more preferable that all of $R^{11}$, $R^{12}$, $R^{13}$, $R^{14}$, $R^{15}$, and $R^{16}$ represent the same group represented by *—$X^{11}$-$L^{11}$-$P^{11}$.

$X^{11}$ and $X^{12}$ each independently preferably represent —O—, —OC(=O)—, OC(=O)O—, —OC(=O)NH—, —C(=O)O—, —C(=O)NH—, —NHC(=O)—, or NHC(=O)O—, more preferably represent —OC(=O)—, —C(=O)O—, —OC(=O)NH—, or C(=O)NH—, and even more preferably represent —C(=O)O—.

$L^{11}$ represents a divalent linking group or a single bond linking $X^{11}$ and $P^{11}$ to each other. Examples of the divalent linking group include —O—, —OC(=O)—, —C(=O)O—, an alkylene group having 1 to 10 carbon atoms (preferably having 1 to 8 carbon atoms and more preferably having 1 to 6 carbon atoms), an arylene group having 6 to 20 carbon atoms (preferably having 6 to 14 carbon atoms and more preferably having 6 to 10 carbon atoms), a group obtained by combining these, and the like.

Examples of the alkylene group having 1 to 10 carbon atoms include a methylene group, an ethylene group, a propylene group, a butylene group, a pentylene group, a hexylene group, and the like.

Examples of the arylene group having 6 to 20 carbon atoms include a 1,4-phenylene group, a 1,3-phenylene group, a 1,4-naphthylene group, a 1,5-naphthylene group, an anthracenylene group, and the like. Among these, a 1,4-phenylene group is preferable.

Each of the alkylene group and the arylene group may have a substituent. Examples of the substituent include the groups exemplified above in the substituent group Y. The number of substituents is preferably 1 to 3, and more preferably 1. The substitution position of the substituent is not particularly limited. As the substituent, a halogen atom or an alkyl group having 1 to 3 carbon atoms is preferable, and a methyl group is more preferable. It is also preferable that the alkylene group and the arylene group are unsubstituted. Particularly, it is preferable that the alkylene group is unsubstituted.

$P^{11}$ represents a curable functional group. The definition of the curable functional group is as described above.

$P^{11}$ is preferably an oxiranyl group.

In a case where $P^{11}$ is a hydroxyl group, $L^{11}$ includes an arylene group, and it is preferable that arylene group is bonded to $P^{11}$.

$Y^{12}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—.

In a case where $Y^{12}$ represents a linear, branched, or cyclic alkyl group having 1 to 20 carbon atoms or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—, $Y^{12}$ may be substituted with a halogen atom.

Examples of the linear or branched alkyl group having 1 to 20 carbon atoms include a methyl group, an ethyl group, a n-propyl group, an isopropyl group, a n-butyl group, an isobutyl group, a sec-butyl group, a tert-butyl group, a n-pentyl group, an isopentyl group, a neopentyl group, a 1,1-dimethylpropyl group, a n-hexyl group, an isohexyl group, a linear or branched heptyl group, an octyl group, a nonyl group, a decyl group, an undecyl group, and a dodecyl group.

The number of carbon atoms in the cyclic alkyl group is preferably equal to or greater than 3, and more preferably equal to or greater than 5. The number of carbon atoms in the cyclic alkyl group is preferably equal to or smaller than 20, more preferably equal to or smaller than 10, even more preferably equal to or smaller than 8, and particularly preferably equal to or smaller than 6. Examples of the cyclic alkyl group include a cyclopropyl group, a cyclobutyl group, a cyclopentyl group, a cyclohexyl group, a cycloheptyl group, and a cyclooctyl group.

$Y^{12}$ is preferably a hydrogen atom, a linear, branched, or cyclic alkyl group having 1 to 20 carbon atoms, or an alkylene oxide group having 1 to 20 carbon atoms, and more preferably a linear or branched alkyl group having 1 to 12 carbon atoms or an ethylene oxide group or propylene oxide group having 1 to 20 carbon atoms.

Regarding specific examples of the compound represented by General Formula (XI), those described in paragraphs "0028" to "0036" in JP1995-281028A (JP-H07-281028A), JP1995-306317A (JP-H07-306317A), paragraphs "0016" to "0018" in JP2005-156822A, paragraphs "0067" to "0072" in JP2006-301614A, and Liquid Crystal Handbook (published on 2000 from MARUZEN Co., Ltd.), pp. 330 to 333 can be referred to.

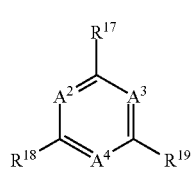

General Formula (XII)

In the formula, $A^2$, $A^3$, and $A^4$ each independently represent —CH= or —N=, $R^{17}$, $R^{18}$, and $R^{19}$ each independently represent *—$X^{211}$—($Z^{21}$—$Z^{212}$)$_{n21}$-$L^{21}$-$P^{21}$ or *—$X^{211}$—($Z^{22}$—$X^{222}$)$_{n22}$—$Y^{22}$, * represents a position bonded to a central ring, two or more among $R^{17}$, $R^{18}$, and $R^{19}$ represent *—$X^{211}$—($Z^{21}$—$X^{212}$)$_{n21}$-$L^{21}$-$P^{21}$, $X^{211}$ and $X^{212}$ each independently represent a single bond, —O—, —C(=O)—, —OC(=O)—, —OC(=O)O—, —OC(O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or SC(=O)S—, $Z^{21}$ and $Z^{22}$ each independently represent an aromatic group as a 5-membered or 6-membered ring or a non-aromatic group as a 5-membered or 6-membered ring, $L^{21}$ represents a divalent linking group or a single bond linking $X^{212}$ and $P^{21}$ to each other, $P^{21}$ represents a curable functional group, $Y^{22}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—, n21 and n22 each independently represent an integer of 0 to 3, and in a case where each of n21 and n22 is equal to or greater than 2, a plurality of groups represented by $Z^{21}$—$X^{212}$ and $Z^{22}$—$X^{222}$ may be the same as or different from each other.

It is preferable that all of $R^{17}$, $R^{18}$, and $R^{19}$ represent *—$X^{211}$—($Z^{21}$—$X^{212}$)$_{n21}$-$L^{21}$-$P^{21}$. It is more preferable that all of $R^{17}$, $R^{18}$, and $R^{19}$ represent the same group represented by *—$X^{211}$—($Z^{21}$—$X^{212}$)$_{n21}$-$L^{21}$-$P^{21}$.

As $X^{221}$ and $X^{222}$, a single bond or —OC(=O)— are preferable.

$Z^{21}$ and $Z^{22}$ each independently represent an aromatic group as a 5-membered or 6-membered ring or a non-aromatic group as a 5-membered or 6-membered ring. Examples thereof include a 1,4-phenylene group, a 1,3-phenylene group, a divalent heterocyclic group, and the like.

The aromatic group and the non-aromatic group described above may have a substituent. Examples of the substituent include the groups exemplified above in the substituent group Y. The number of substituents is preferably 1 or 2, and more preferably 1. The substitution position of the substituent is not particularly limited. As the substituent, a halogen atom or a methyl group is preferable. As the halogen atom, a chlorine atom or a fluorine atom is preferable. It is also preferable that the aromatic group and the non-aromatic group are unsubstituted.

Examples of the divalent heterocyclic ring include the following heterocyclic rings.

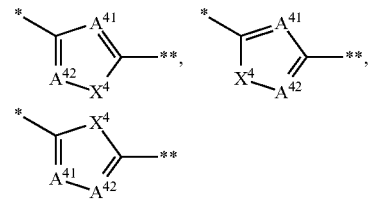

In the formulae, * represents a portion bonded to $X^{211}$, ** represents a portion bonded to $X^{212}$; $A^{41}$ and $A^{42}$ each independently represent a methine group or a nitrogen atom; and $X^4$ represents an oxygen atom, a sulfur atom, a methylene group, or an imino group.

It is preferable that at least one of $A^{41}$ or $A^{42}$ represents a nitrogen atom. It is more preferable that both of $A^{41}$ and $A^{42}$ represent a nitrogen atom. Furthermore, it is preferable that $X^4$ represents an oxygen atom.

$L^{21}$ represents a divalent linking group or a single bond linking $X^{212}$ and $P^{21}$ to each other, and has the same definition as $L^{11}$ in General Formula (XI). As $L^{21}$, —O—, —OC(=O)—, —C(=O)O—, an alkylene group having 1 to 10 carbon atoms (preferably 1 to 8 carbon atoms and more preferably 1 to 6 carbon atoms), or a group obtained by combining these is preferable.

$P^{21}$ represents a curable functional group. The definition of the curable functional group is as described above.

$Y^{22}$ each independently represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—. $Y^{22}$ has the same definition as $Y^{12}$ in General Formula (XI), and the preferred range thereof is also the same as the preferred range of $Y^{12}$ in General Formula (XI).

n21 and n22 each independently represent an integer of 0 to 3. n21 and n22 each independently preferably represent an integer of 1 to 3, and more preferably represent 2 or 3.

Regarding the details and specific examples of the compound represented by General Formula (XII), the description in paragraphs "0013" to "0077" in JP2010-244038A can be referred to, and the contents thereof are incorporated into the present specification.

In view of reinforcing stacking by reducing electron density and making it easy to form a columnar aggregate, it is preferable that the compound represented by General Formula (XI) or (XII) is a compound having a hydrogen bonding functional group.

Examples of the hydrogen bonding functional group include —OC(=O)NH—, —C(=O)NH—, —NHC(=O)—, —NHC(=O)O—, —NHC(=O)NH—, —NHC(=O)S—, SC(=O)NH—, and the like.

Specific examples of compounds particularly preferable as the compound represented by General Formula (XI) and the compound represented by General Formula (XII) include the following compounds.

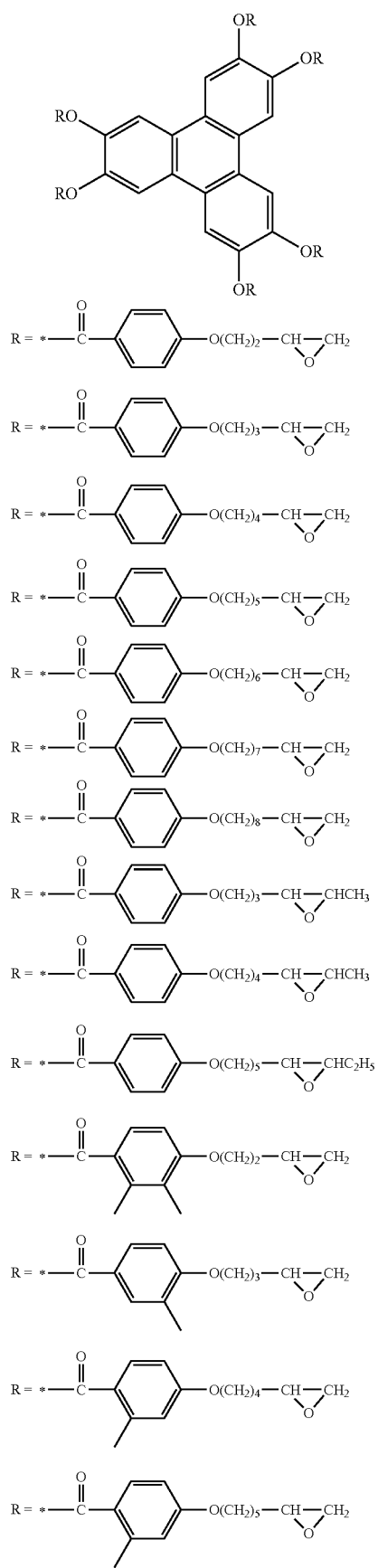
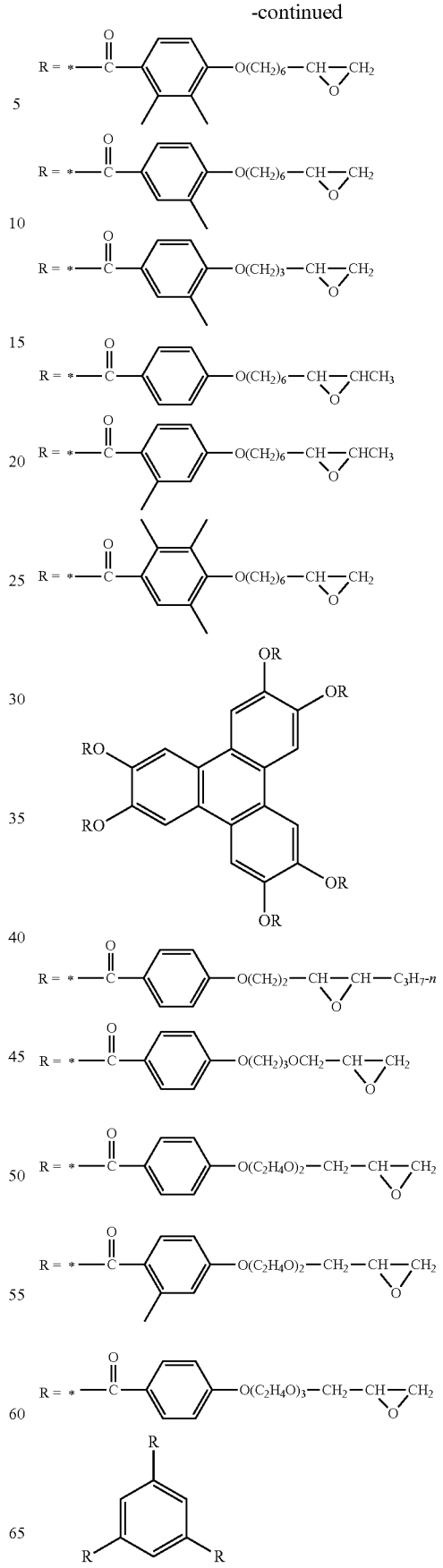

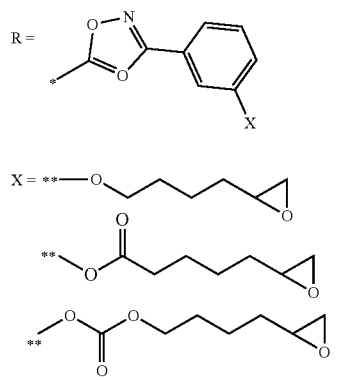
**represents a binding position. The same is true for the following description.
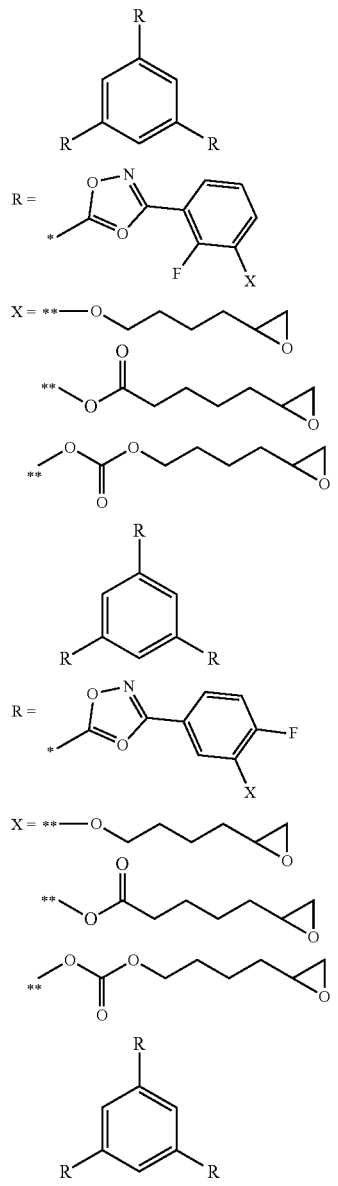
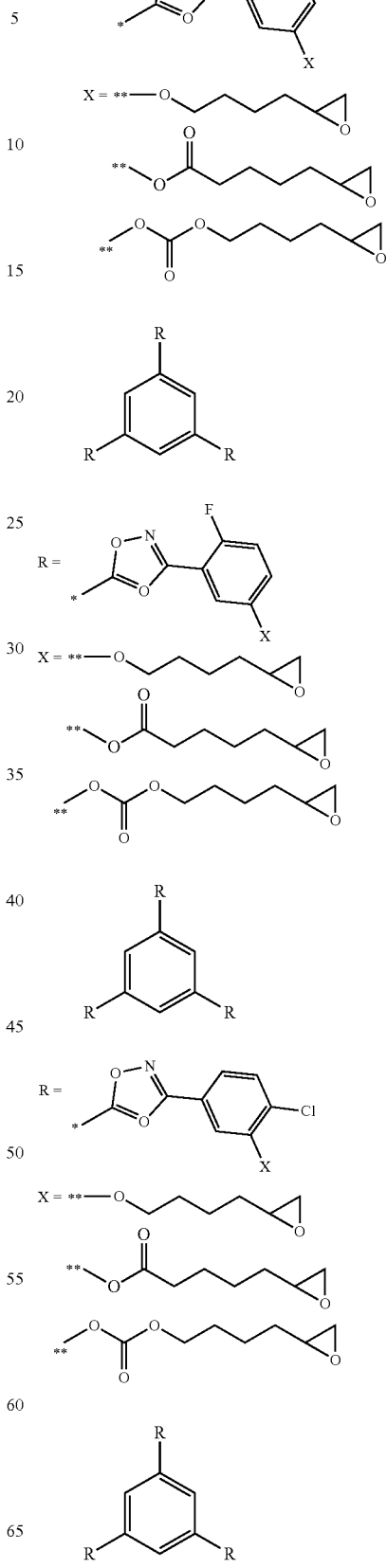

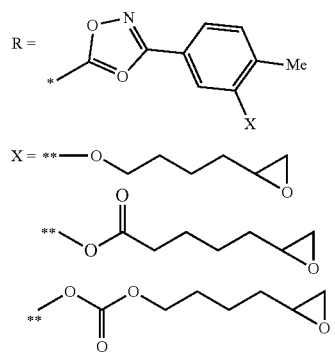
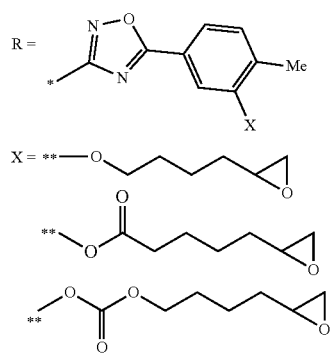
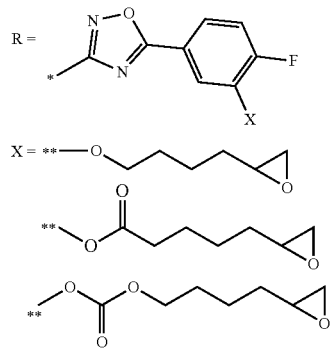
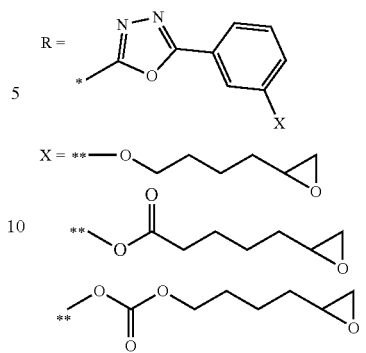
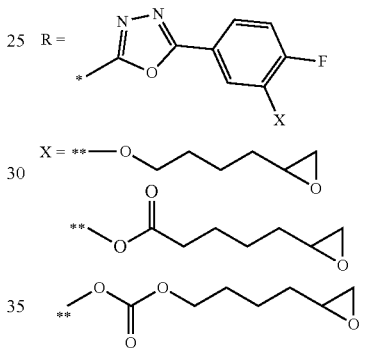
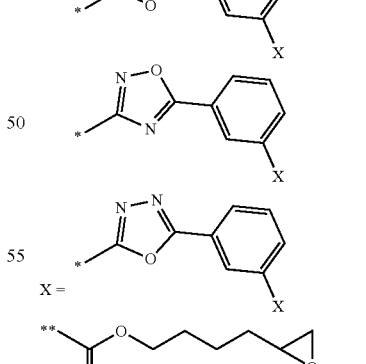

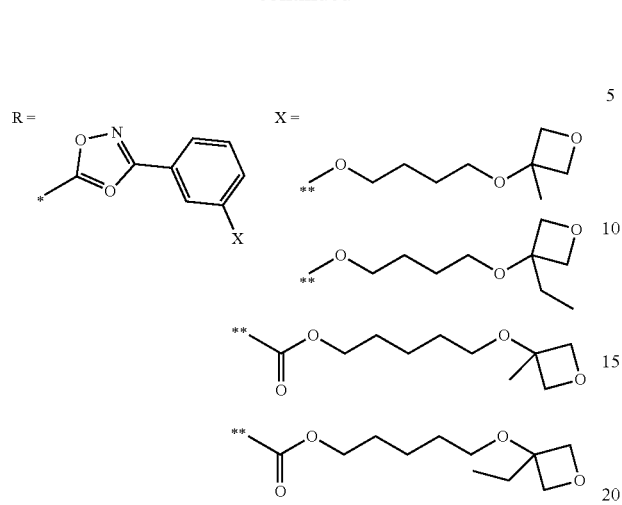
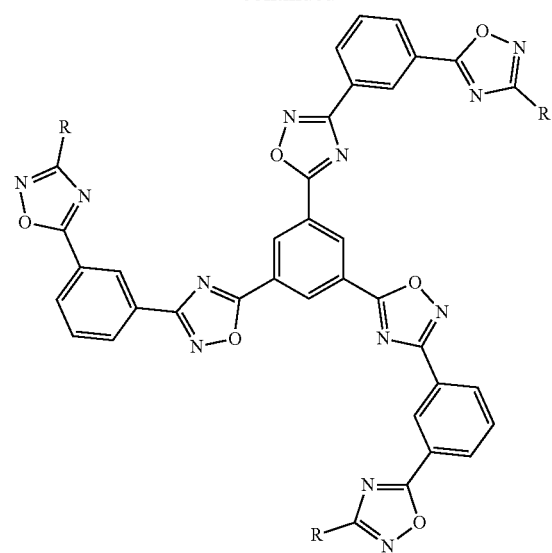
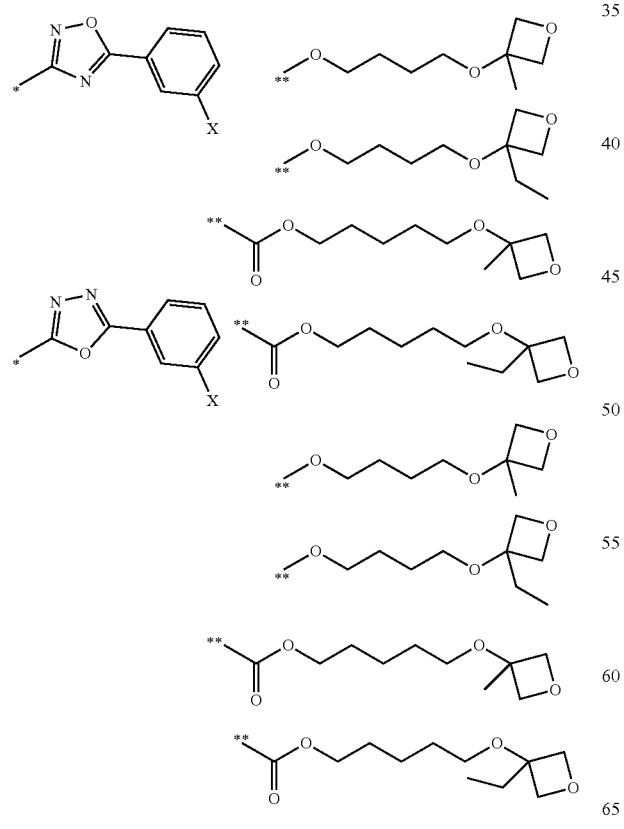

-continued
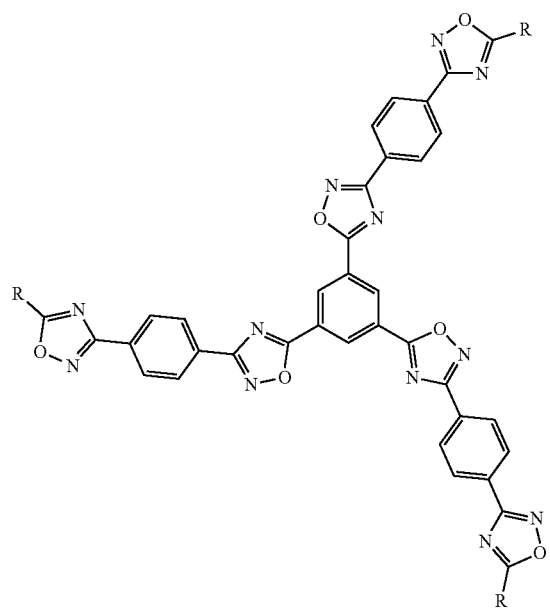
-continued
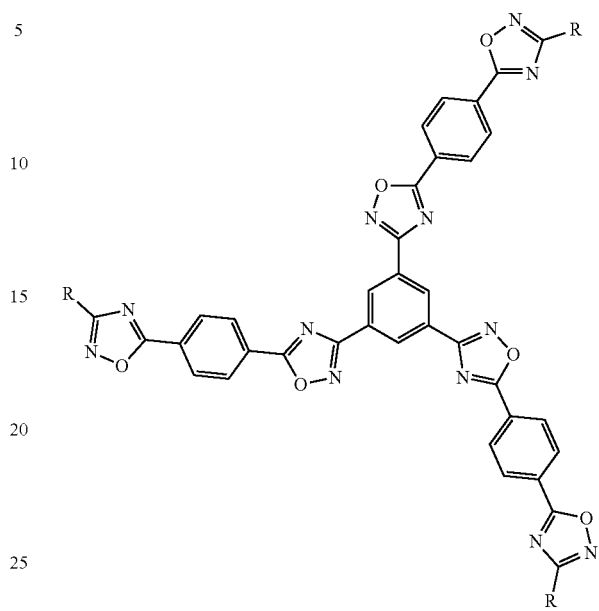
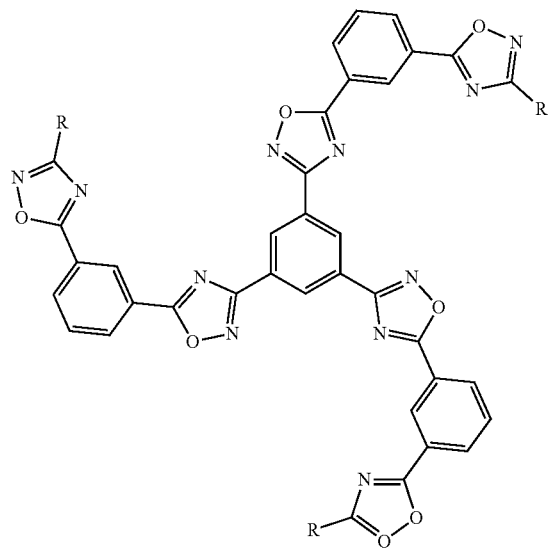
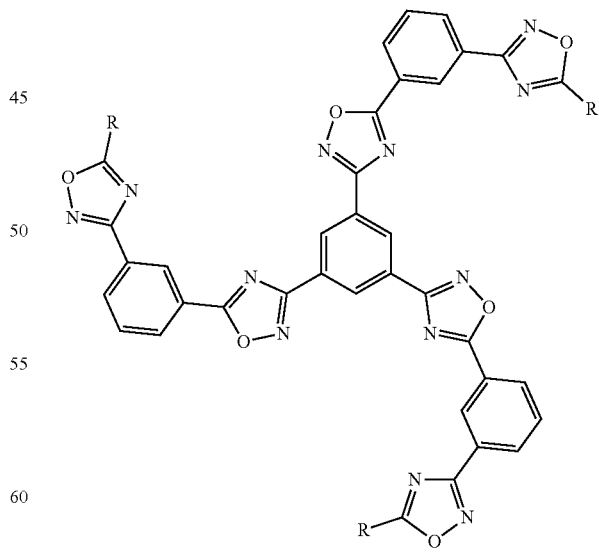

-continued

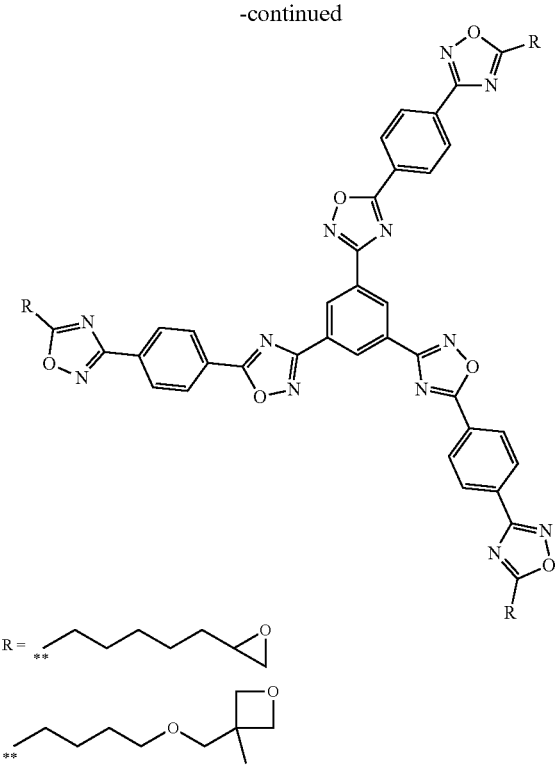

The compound represented by General Formula (XI) can be synthesized based on the methods described in JP1995-306317A (JP-H07-306317A), JP1995-281028A (JP-H07-281028A), JP2005-156822A, and JP2006-301614A.

The compound represented by General Formula (XII) can be synthesized based on the methods described in JP2010-244038A, JP2006-076992A, and JP2007-002220A.

(Curing Agent)

The composition may contain a curing agent.

The type of the curing agent is not particularly limited, and the curing agent may be a compound which can cure the aforementioned curable compound. The curing agent is preferably a compound having a functional group selected from the group consisting of a hydroxyl group, an amino group, a thiol group, an isocyanate group, a carboxyl group, and a carboxylic acid anhydride group, and more preferably a compound having a functional group selected from the group consisting of a hydroxyl group, an amino group, and a thiol group.

The curing agent preferably has two or more functional groups described above and more preferably has two functional groups described above.

Examples of the curing agent include an amine-based curing agent, a phenol-based curing agent, a guanidine-based curing agent, an imidazole-based curing agent, a naphthol-based curing agent, an acid anhydride-based curing agent, an active ester-based curing agent, a benzoxazine-based curing agent, a cyanate ester-based curing agent, and the like. Among these, a phenol-based curing agent or an amine-based curing agent is preferable.

The content of the curing agent in the composition is not particularly limited, but is preferably 1% to 50% by mass and more preferably 5% to 40% by mass with respect to the total solid content in the composition.

(Curing Accelerator)

The composition may contain a curing accelerator.

The type of the curing accelerator is not particularly limited, and examples thereof include triphenylphosphine, 2-ethyl-4-methylimidazole, a boron trifluoride amine complex, 1-benzyl-2-methylimidazole, and those described in paragraph "0052" in JP2012-067225A.

The content of the curing accelerator in the composition is not particularly limited, but is preferably 0.1% to 20% by mass with respect to the total solid content in the composition.

(Polymerization Initiator)

The composition may contain a polymerization initiator. Particularly, in a case where the curable compound has a (meth)acryloyl group, it is preferable that the composition contains the polymerization initiator described in paragraph "0062" in JP2010-125782A and paragraph "0054" in JP2015-052710A.

The content of the polymerization initiator in the composition is not particularly limited, but is preferably 0.1% to 20% by mass with respect to the total solid content in the composition.

(Solvent)

The composition may contain a solvent.

The type of the solvent is not particularly limited, but the solvent is preferably an organic solvent. Examples of the organic solvent include ethyl acetate, methyl ethyl ketone, dichloromethane, tetrahydrofuran, and the like.

(Filler)

The composition may contain a filler other than the aforementioned inorganic nitride.

Examples of the filler include an inorganic oxide. More specifically, examples thereof include silica, alumina, and the like.

<Method for Manufacturing Composition>

The method for manufacturing the composition is not particularly limited, and known methods can be adopted. For example, the composition can be manufactured by mixing together the aforementioned various components (the surface-modified inorganic nitride, the curable compound, and the like) by a known method. At the time of mixing, the various components may be mixed at a time or mixed sequentially.

Furthermore, as described above, at the time of manufacturing the surface-modified inorganic nitride, the inorganic nitride, the onium salt, and other additives may be mixed together at a time so as to manufacture the composition.

<Method for Curing Composition>

The method for curing the composition is not particularly limited, and according to the type of the curable compound, an optimal method is appropriately selected. The curing method may be a thermal curing reaction or a photocuring reaction for example, and is preferably a thermal curing reaction.

The heating temperature at the time of the thermal curing reaction is not particularly limited, and may be appropriately selected within a range of 50° C. to 200° C., for example. Furthermore, at the time of performing the thermal curing reaction, heating treatment may be performed plural times at different temperatures.

The curing reaction is preferably performed on the composition formed into a sheet. Specifically, coating may be performed using the composition, and the obtained coating film may be subjected to the curing reaction. At this time, press working may also be performed.

The curing reaction may be a semi-curing reaction. That is, the obtained cured substance may be in a so-called B stage state (semi-cured state).

In a case where the cured substance semi-cured as described above is disposed to contact a device or the like, and then permanently cured by heating and the like, the adhesiveness between a layer containing a thermally conductive material, which is the cured substance, and the device is further improved.

<Use>

The surface-modified inorganic nitride and the composition described above can be used for various uses. For example, the surface-modified inorganic nitride and the composition can be applied to various fields as a pigment, a catalyst, an electrode material, a semiconductor material, a thermally conductive material, a lubricant, and the like. That is, a material containing the surface-modified inorganic nitride can be used for various uses. The shape of the material containing the surface-modified inorganic nitride is not particularly limited, and may be a sheet shape.

Particularly, the surface-modified inorganic nitride and the composition described above are preferably used for forming a thermally conductive material or a lubricant.

Hereinafter, the suitable use will be specifically described.

(Thermally Conductive Material)

The thermally conductive material of the embodiment of the present invention contains the surface-modified inorganic nitride.

The thermally conductive material may contain components other than the surface-modified inorganic nitride, and examples thereof include a binder. Examples of the binder include a binder formed by curing the curable compound described above.

The thermally conductive material can be prepared by curing the composition described above. That is, the composition can be used for forming the thermally conductive material. Regarding the preparation of the thermally conductive material including a curing reaction, "Highly Thermally Conductive Composite Material" (CMC Publishing CO., LTD., Yoshitaka Takezawa) can be referred to.

The thermally conductive material may contain the surface-modified inorganic nitride, and the method for manufacturing the thermally conductive material is not limited to the aspect in which the aforementioned composition is used.

The thermally conductive material is a material having excellent thermal conductivity, and can be used as a heat dissipation material such as a heat dissipation sheet. For example, the thermally conductive material can be used for dissipating heat from various devices such as power semiconductor devices. More specifically, in a case where a device with a thermally conductive layer is prepared by disposing a thermally conductive layer containing the thermally conductive material on a device, the heat generated from the device can be efficiently dissipated by the thermally conductive layer.

The shape of the thermally conductive material is not particularly limited, and the thermally conductive material can be molded to have various shapes according to the use. Typically, the thermally conductive material is preferably in the form of a sheet.

The thermally conductive material may be in a completely cured state or a semi-cured state (B stage state described above). As described above, in a case where the thermally conductive material is in a semi-cured state, by disposing the thermally conductive material on a device and then performing a heating treatment thereon, a thermally conductive layer having excellent adhesiveness can be Ruined on the device.

(Lubricant)

The surface-modified inorganic nitride can be suitably used for preparing a lubricant. That is, examples of the use of the surface-modified inorganic nitride include a lubricant containing the surface-modified inorganic nitride.

The lubricant can be prepared by mixing the surface-modified inorganic nitride with grease (a low-molecular weight monomer or a polymer resin) or the like. As the grease, known materials can be used.

As an example of the inorganic nitride in the surface-modified inorganic nitride for preparing the lubricant, boron nitride is preferable, because boron nitride is known to exhibit lubricating properties by itself in a high temperature region.

EXAMPLES

Hereinafter, characteristics of the present invention will be more specifically described based on examples and comparative examples. The materials, the amount and proportion of the materials used, the details of treatments, the procedure of treatments, and the like shown in the following examples can be appropriately changed within a range that does not depart from the gist of the present invention. Accordingly, the scope of the present invention is not limited to the following specific examples.

<Establishment of Experimental System>

Alizarin is a compound which is well known to modify the surface of zinc oxide by being bonded to zinc oxide (JP5479175B). Alizarin (12 mg, manufactured by Wako Pure Chemical Industries, Ltd., catalog No. 015-01151) was dissolved in 300 mL of methyl ethyl ketone. By using a visible absorption spectrum (measurement apparatus: UV-3100PC manufactured by Shimadzu Corporation) of the solution, the absorbance at a wavelength of 427 nm was measured. Furthermore, separately prepared fine zinc oxide particles (manufactured by Wako Pure Chemical Industries, Ltd., 264-00365) were added to 25 mL of the solution and gently stirred. After about 5 minutes, the supernatant solution of the obtained solution was filtered using a 0.45 µm filter (Minisart RC15 manufactured by Sartorius). For the obtained filtrate, the absorbance was measured in the same manner as described above. As a result, the absorbance of the solution obtained after the addition of the fine zinc oxide particles was 27.6% of the absorbance of the solution obtained before the addition of the fine zinc oxide particles. From the obtained result, it was understood that, by comparing the absorbances as described above, from the decrement of the absorbance, it is possible to determine whether or not the surface of an inorganic nitride is modified with a compound and to determine the degree of surface modification.

<Testing Adsorption onto Inorganic Nitride>

A compound 1 (5.0 mg) shown below was dissolved in dichloromethane (300 mL), thereby obtaining a solution. Then, an ultraviolet•visible absorption spectrum (measurement apparatus: UV-3100PC manufactured by Shimadzu Corporation) of the obtained solution was measured, and an absorbance X at an absorption wavelength of 348 nm was determined.

Thereafter, boron nitride (manufactured by 3M, BORONID Cooling Filer Platelate 001) (500 mg) was added to the solution (25 mL) and gently stirred with a stirring rod. After about 5 minutes, the supernatant solution of the obtained solution was filtered using a 0.45 µm filter (manufactured by Sartorius, Minisart RC15). By using the obtained filtrate, an ultraviolet•visible absorption spectrum (measurement apparatus: UV-3100PC manufactured by Shimadzu Corporation) of the filtrate was measured in the same manner as described above, and an absorbance Y at an absorption wavelength of 348 nm was determined. The results of the ultraviolet·visible absorption spectra are shown in the FIGURE.

A ratio of the absorbance Y of the filtrate, which was obtained by the addition of boron nitride, measured at an absorption wavelength of 348 nm to the absorbance X of the solution, to which boron nitride was not yet added, measured at an absorption wavelength of 348 nm was calculated. As a result, the ratio was 8.4%. That is, a residual rate of the absorbance after the addition of boron nitride was calculated to be 8.4%.

Furthermore, the residual rate of the absorbance after the addition of boron nitride was calculated in the same procedure as that described above by using the following compound 2 instead of the compound 1. As a result, the residual rate was 26.6%. As the absorbance determined using the compound 2, an absorbance at a wavelength of 356 nm was used.

In addition, the residual rate of the absorbance after the addition of boron nitride was calculated in the same procedure as that described above by using each compound shown in Table 1, which will be described later, instead of the compound 1. The results are summarized in Table 1 which will be described later. The measurement wavelengths (absorption wavelength) for the absorbance in the examples in which the respective compounds were used are also summarized in Table 1 which will be described later.

Compound 1 (the Following Structural Formula)

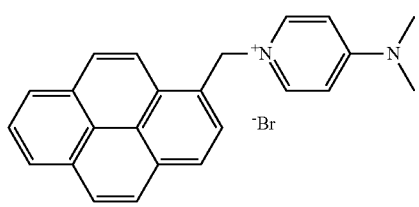

Compound 2 (the Following Structural Formula)

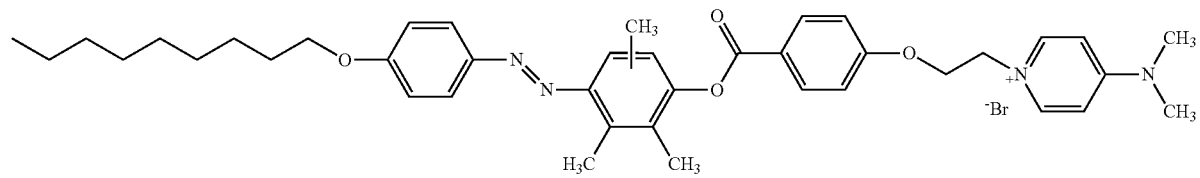

than before the addition of boron nitride. The decrement corresponds to the formation of a monolayer resulting from the adsorption of the onium salt onto the surface of the boron nitride. It is understood that the decrement is markedly high compared to a decrement of absorbance obtained in a case where another compound such as hydroxypyrene having a phenolic hydroxyl group is used.

In a case where a pyridinium salt 1, a pyridinium salt 2, an imidazolium salt 1, an imidazolium salt 2, a boronic acid 1, and an aldehyde 1, which were used in examples that will be described later, were used instead of the compound 1, an absorbance change similar to that resulting from the compound 1 was checked before and after the addition of boron nitride. From this result, it was confirmed that various components described above were adsorbed onto the surface of the boron nitride.

Example 1

Boron nitride (5.0 g), an epoxy compound 1 (2.5 g), 1,4-paraphenylenediamine (2.5 g), and the pyridinium salt 1 (0.05 g) were added to methyl ethyl ketone (5 g), and the obtained mixture was dispersed using a mixing rotor, thereby obtaining a varnish-like composition 1. The composition 1 contained surface-modified inorganic boron obtained by the adsorption of the pyridinium salt 1 onto the surface of boron nitride.

Then, by using an applicator, a release surface of a polyethylene terephthalate film (COSMOSHINE, manufactured by Toyobo Co., Ltd, film thickness: 50 μm, hereinafter, simply described as "PET film" in some cases) was coated with the composition 1 such that the thickness thereof became about 300 μm, and the obtained film was left to stand in the air for 10 to 15 minutes. Thereafter, the PET film having the obtained coating film was dried for 30 minutes in an oven with a temperature of 100° C. Subsequently, the surface of the coating film was covered with another PET film and heat-pressed in a vacuum (heat plate temperature: 150° C., degree of vacuum≤1 kPa, pressure: 4 MPa, treatment time: 10 minutes), thereby obtaining a laminate. The laminate was subjected to a planarization treatment, thereby obtaining a resin sheet 1 having a thickness of 200 μm.

The PET film on both surfaces of the resin sheet 1 was peeled, thereby obtaining a self-supported film of the resin sheet 1. The resin sheet 1 was stepwise cured in an oven for 2 hours at 140° C., 2 hours at 165° C., and 2 hours at 190° C., thereby obtaining a sample 1.

Examples 2 to 20 and Comparative Examples 1 to 3

Samples 2 to 20 and samples C1 to C3 were prepared in the same procedure as that in Example 1, except that the type of compound used was changed as shown in Table 2.

TABLE 1

| | Absorption wavelength (nm) | Absorbance before addition | Absorbance after addition | Residual rate (%) |
|---|---|---|---|---|
| Compound 1 | 348 | 1.15 | 0.097 | 8.4 |
| Compound 2 | 356 | 0.693 | 0.184 | 26.6 |
| Pyrene | 337 | 0.862 | 0.777 | 90.1 |
| 1-Pyrenemethanol | 344 | 0.73 | 0.452 | 61.9 |
| 1-Nitropyrene | 404 | 0.832 | 0.674 | 81 |
| 1-Bromopyrene | 346 | 0.96 | 0.733 | 76.4 |
| 1-Aminopyrene | 398 | 0.602 | 0.513 | 85.2 |
| 1-Hydroxypyrene | 383 | 0.28 | 0.206 | 73.6 |
| 1-Pyrene-carboxylic acid | 396 | 1.102 | 0.822 | 74.6 |

As is evident from the results in Table 1, in the case of the onium salts such as the compounds 1 and 2, the absorbance was markedly decreased after the addition of boron nitride The amount of each of the components in Examples 2 to 20 and Comparative Examples 1 to 3 shown in Table 2 was the same as the amount of each of the corresponding components in Example 1.

A sample obtained by Example X is referred to as sample X, and a sample obtained by Comparative Example Y is referred to as sample CY.

The compounds used in examples and comparative examples will be shown below.

(Surface Modifier)

The following onium salts were synthesized with reference to JP2006-113500A, JP2006-106662A, JP2011-133549A, JP2005-272422A, and the like.

Pyridinium salt 1 (the following structural formula: liquid crystal type)

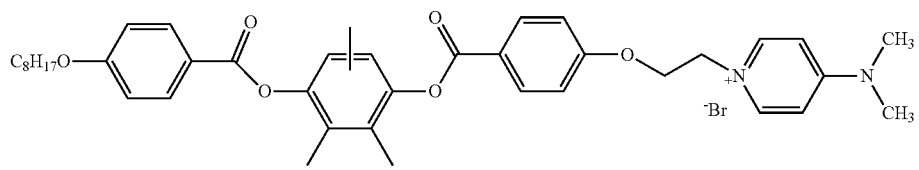

Pyridinium salt 2 (the following structural formula: non-liquid crystal type)

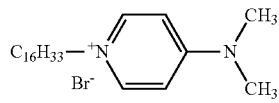

Imidazolium salt 1 (the following structural formula: liquid crystal type)

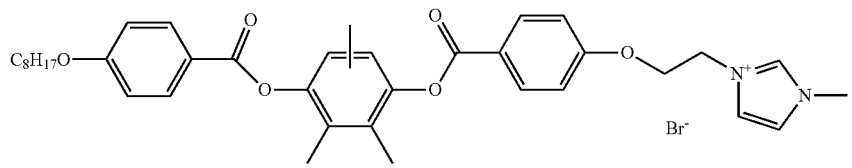

Imidazolium salt 2 (the following structural formula: non-liquid crystal type)

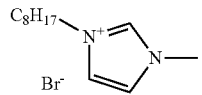

Boronic acid 1: p-hydroxyphenylboronic acid (manufactured by Wako Pure Chemical Industries, Ltd.)

Aldehyde 1: 4-hydroxybenzaldehyde (transformant Sigma-Aldrich Co. LLC.)

(Epoxy compound 1: disk-like liquid crystal compound)

According to the method described in examples in JP2696480B, a compound TP-85 was synthesized and used as an epoxy compound 1 (the following structural formula).

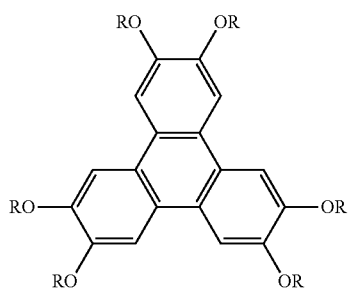

-continued

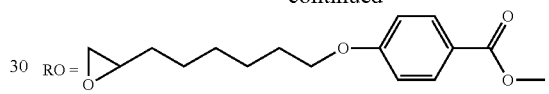

(Epoxy Compound 2: Rod-Like Liquid Crystal Compound)

According to the method described in a document (Molecular Crystals and Liquid Crystals Science and Technology Section A: Molecular Crystals and Liquid Crystals, 1995, vol. 266, p. 9-22), the following epoxy compound 2 was synthesized.

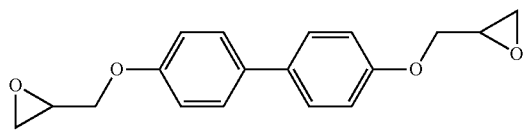 [SMILES: c1cc(-c2ccc(OCC3CO3)cc2)ccc1OCC1CO1]

(Epoxy Compound 3)

Commercial 2,2-bis(4-glycidyloxyphenyl)propane (manufactured by TOKYO CHEMICAL INDUSTRY CO., LTD.) was used as an epoxy compound 3.

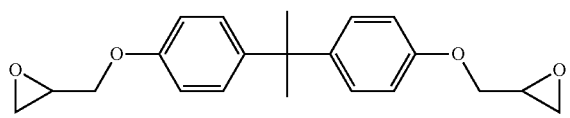 [SMILES: CC(C)(c1ccc(OCC2CO2)cc1)c1ccc(OCC2CO2)cc1]

(Curing Agent)

Curing agent 1: 1,4-paraphenylenediamine (transformant TOKYO CHEMICAL INDUSTRY CO., LTD.)

(Inorganic Substance)

Boron nitride 1 (hereinafter, described as BN1): DENKA BORON NITRIDE FP70 (manufactured by Denka Company Limited.: average particle diameter: 70 μm)

Aluminum nitride 1 (hereinafter, described as AlN1): FAN-f30-TY (manufactured by Furukawa Denshi Co., Ltd.: average particle diameter: 30 μm)

Alumina 1: DAW-05 (manufactured by Denka Company Limited.: average particle diameter: 5 μm)

<Measurement of Thermal Conductivity>

(1) By using "ai-Phase Mobile 1u" manufactured by ai-Phase Co., Ltd., a coefficient of thermal diffusively of the sample in a thickness direction was measured.

(2) By using a balance "XS204" ("solid specific gravity measuring kit" was used) manufactured by METTLER TOLEDO, the specific gravity of the sample was measured.

(3) By using "DSC320/6200" manufactured by Seiko Instruments Inc. and software of DSC7, the specific heat of the sample at 25° C. was determined under the heating condition of 10° C./min.

(4) The obtained coefficient of thermal diffusively was multiplied by the specific gravity and the specific heat, thereby calculating the thermal conductivity of the sample.

The results are shown in Table 2.

In the column of "Inorganic nitride" in Table 2, two kinds of inorganic nitrides were used in Examples 13 to 20, and the mass ratio represents a mass ratio (A/B) between a component A described on the left side and a component B described on the right side. For example, in Example 13, a mass ratio between BN1 and the alumina 1 (BN1/alumina 1) is 6/4.

Furthermore, the column of "Surface modifier" in Table 2, two kinds of surface modifiers were used in Examples 13 to 20, and the mass ratio represents a mass ratio (A/B) between a component A described on the left side and a component B described on the right side. For example, in Example 13, a mass ratio between the pyridinium salt 1 and the boronic acid 1 (pyridinium salt 1/boronic acid 1) is 5/5.

TABLE 2

| | Inorganic nitride | Curable compound | Curing agent | Surface modifier | Thermal conductivity (W/m · K) |
|---|---|---|---|---|---|
| Example 1 | BN1 | Epoxy compound 1 (disk-like liquid crystal compound) | Curing agent 1 | Pyridinium salt 1 (liquid crystal type) | 10.1 |
| Example 2 | BN1 | Epoxy compound 1 (disk-like liquid crystal compound) | Curing agent 1 | Pyridinium salt 2 (non-liquid crystal type) | 8.8 |
| Example 3 | BN1 | Epoxy compound 2 (rod-like liquid crystal compound) | Curing agent 1 | Pyridinium salt 1 (liquid crystal type) | 9.6 |
| Example 4 | BN1 | Epoxy compound 2 (rod-like liquid crystal compound) | Curing agent 1 | Pyridinium salt 2 (non-liquid crystal type) | 8.1 |
| Example 5 | BN1 | Epoxy compound 3 | Curing agent 1 | Pyridinium salt 1 (liquid crystal type) | 8.3 |
| Example 6 | BN1 | Epoxy compound 3 | Curing agent 1 | Pyridinium salt 2 (non-liquid crystal type) | 7.6 |
| Example 7 | BN1 | Epoxy compound 1 (disk-like liquid crystal compound) | Curing agent 1 | Imidazolium salt 1 (liquid crystal type) | 9.5 |
| Example 8 | BN1 | Epoxy compound 1 (disk-like liquid crystal compound) | Curing agent 1 | Imidazolium salt 2 (non-liquid crystal type) | 8.4 |
| Example 9 | BN1 | Epoxy compound 2 (rod-like liquid crystal compound) | Curing agent 1 | Imidazolium salt 1 (liquid crystal type) | 9.1 |
| Example 10 | BN1 | Epoxy compound 2 (rod-like liquid crystal compound) | Curing agent 1 | Imidazolium salt 2 (non-liquid crystal type) | 8.3 |
| Example 11 | BN1 | Epoxy compound 3 | Curing agent 1 | Imidazolium salt 1 (liquid crystal type) | 8.3 |
| Example 12 | BN1 | Epoxy compound 3 | Curing agent 1 | Imidazolium salt 2 (non-liquid crystal type) | 7.2 |
| Example 13 | BN1 + Alumina 1 (mass ratio: 6/4) | Epoxy compound 1 (disk-like liquid crystal compound) | Curing agent 1 | Pyridinium salt 1 (liquid crystal type) + boronic acid 1 (mass ratio: 5/5) | 13.5 |
| Example 14 | BN1 + Alumina 1 (mass ratio: 6/4) | Epoxy compound 2 (rod-like liquid crystal compound) | Curing agent 1 | Pyridinium salt 1 (liquid crystal type) + boronic acid 1 (mass ratio: 5/5) | 13.3 |
| Example 15 | BN1 + Alumina 1 (mass ratio: 6/4) | Epoxy compound 1 (disk-like liquid crystal compound) | Curing agent 1 | Pyridinium salt 1 (liquid crystal type) + aldehyde 1 (mass ratio: 5/5) | 14.4 |
| Example 16 | BN1 + Alumina 1 (mass ratio: 6/4) | Epoxy compound 2 (rod-like liquid crystal compound) | Curing agent 1 | Pyridinium salt 1 (liquid crystal type) + aldehyde 1 (mass ratio: 5/5) | 13.8 |
| Example 17 | AlN1 + Alumina 1 (mass ratio: 6/4) | Epoxy compound 1 (disk-like liquid crystal compound) | Curing agent 1 | Pyridinium salt 1 (liquid crystal type) + boronic acid 1 (mass ratio: 5/5) | 15.1 |
| Example 18 | AlN1 + Alumina 1 (mass ratio: 6/4) | Epoxy compound 2 (rod-like liquid crystal compound) | Curing agent 1 | Pyridinium salt 1 (liquid crystal type) + boronic acid 1 (mass ratio: 5/5) | 14.8 |
| Example 19 | AlN1 + Alumina 1 (mass ratio: 6/4) | Epoxy compound 1 (disk-like liquid crystal compound) | Curing agent 1 | Pyridinium salt (liquid crystal type) + aldehyde 1 (mass ratio: 5/5) | 14.6 |
| Example 20 | AlN1 + Alumina 1 (mass ratio: 6/4) | Epoxy compound 2 (rod-like liquid crystal compound) | Curing agent 1 | Pyridinium salt 1 (liquid crystal type) + aldehyde 1 (mass ratio: 5/5) | 14.3 |
| Comparative Example 1 | BN1 | Epoxy compound 3 | Curing agent 1 | N/A | 4.5 |

TABLE 2-continued

|  | Inorganic nitride | Curable compound | Curing agent | Surface modifier | Thermal conductivity (W/m · K) |
|---|---|---|---|---|---|
| Comparative Example 2 | BN1 + Alumina 1 (mass ratio: 6/4) | Epoxy compound 3 | Curing agent 1 | N/A | 5.4 |
| Comparative Example 3 | AlN1 + Alumina1 (mass ratio: 6/4) | Epoxy compound 3 | Curing agent 1 | N/A | 6.5 |

As shown in the above table, it was confirmed that in a case where the surface-modified inorganic nitride of the embodiment of the present invention is used, the thermal conductivity is further improved. The improvement of thermal conductivity results from the improvement of the dispersibility of the surface-modified inorganic nitride in the sample. That is, it was confirmed that the affinity between the surface-modified inorganic nitride and an organic substance is improved.

Particularly, through the comparison between Examples 1 and 2, it was confirmed that in a case where the onium salt has the group represented by General Formula (1) (in other words, in a case where the onium salt is the compound represented by General Formula (3)), the thermal conductivity is further improved.

Particularly, through the comparison between Examples 1, 3, and 5, it was confirmed that in a case where a liquid crystal compound having a curable functional group is used as a curable compound, the thermal conductivity is further improved. Furthermore, through the comparison between Examples 1 and 3, it was confirmed that in a case where a disk-like liquid crystal compound is used, the thermal conductivity is further improved.

In addition, it was confirmed that in a case where an onium salt and an aldehyde or boronic acid are used in combination as a surface modifier as shown in Examples 13 to 20, the thermal conductivity is further improved.

In Comparative Examples 1 to 3 in which an onium salt was not used as a surface modifier, a desired effect was not obtained.

What is claimed is:

1. A surface-modified inorganic nitride comprising:
an inorganic nitride; and
an onium salt adsorbed onto a surface of the inorganic nitride,
wherein the onium salt is a compound represented by General Formula (3),

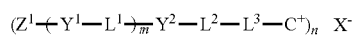

General Formula (3)

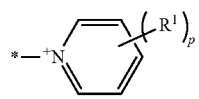

General Formula (4)

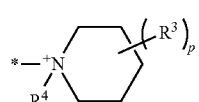

General Formula (6)

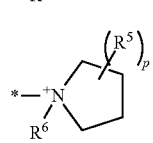

General Formula (7)

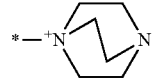

General Formula (8)

in General Formula (3), $Y^1$ and $Y^2$ each independently represent a divalent linking group having a 5-membered ring or a 6-membered ring that may have a substituent, $L^1$ and $L^2$ each independently represent a single bond or a divalent linking group, m represents an integer of 1 to 5, $L^3$ represents a divalent aliphatic hydrocarbon group or a divalent aromatic hydrocarbon group, $Z^1$ represents a substituent, $X^-$ represents an n-valent anion, and n represents an integer of 1 to 3, $C^+$ represents a group selected from the group consisting of a group represented by General Formula (4), a group represented by General Formula (6), a group represented by General Formula (7), and a group represented by General Formula (8), wherein * in General Formula (4) and General Formula (6) to General Formula (8) represents a position bonded to $L^3$ in General Formula (3), and $R^1$ and $R^3$ to $R^6$ in General Formula (4), General Formula (6), and General Formula (7) each independently represent a substituent, and p in General Formula (4), General Formula (6), and General Formula (7) each independently represents an integer of 0 to 4.

2. The surface-modified inorganic nitride according to claim 1,
wherein the onium salt is a compound represented by General Formula (9),

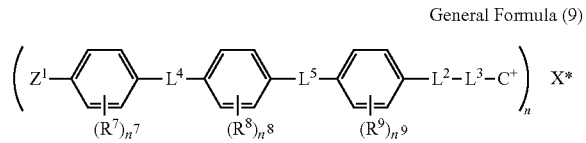

General Formula (9)

in General Formula (9), $Z^1$ represents a substituent, $L^2$, $L^4$, and $L^5$ each represents a single bond or a divalent linking group, $L^3$ represents a divalent aliphatic hydrocarbon group or a divalent aromatic hydrocarbon group, $X^-$ represents an n-valent anion, n represents an integer of 1 to 3, $R^7$, $R^8$, and $R^9$ each independently represent an alkyl group having 1 to 12 carbon atoms, $n^7$ represents an integer of 0 to 4, $n^8$ represents an integer of 1 to 4, and $n^9$ represents an integer of 0 to 4, and $C^+$ represents a group selected from the group consisting of the group represented by General Formula (4), the group represented by General Formula (6), the group represented by General Formula (7), and the group represented by the General Formula (8).

3. The surface-modified inorganic nitride according to claim 1,
wherein $C^+$ is the group represented by General Formula (4).

4. A surface-modified inorganic nitride comprising:
an inorganic nitride; and
an onium salt adsorbed onto a surface of the inorganic nitride,
wherein the onium salt is a compound represented by General Formula (9),

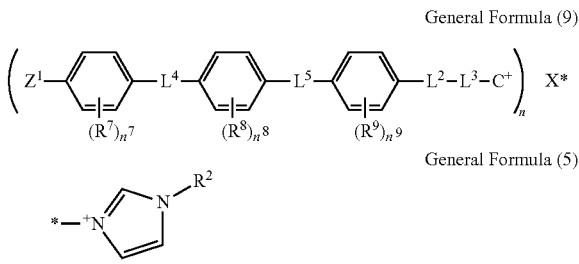

General Formula (9)

General Formula (5)

in General Formula (9), $Z^1$ represents a substituent, $L^2$, $L^4$, and $L^5$ each represents a single bond or a divalent linking group, $L^3$ represents a divalent aliphatic hydrocarbon group or a divalent aromatic hydrocarbon group, $X^-$ represents an n-valent anion, n represents an integer of 1 to 3, $R^7$, $R^8$, and $R^9$ each independently represent an alkyl group having 1 to 12 carbon atoms, $n^7$ represents an integer of 0 to 4, $n^8$ represents an integer of 1 to 4, and $n^9$ represents an integer of 0 to 4, and
$C^+$ represents a group represented by General Formula (5),
wherein, in General Formula (5), $R^2$ represents a substituent.

5. The surface-modified inorganic nitride according to claim 1,
wherein the inorganic nitride contains at least one kind of atom selected from the group consisting of a boron atom, an aluminum atom, and a silicon atom.

6. The surface-modified inorganic nitride according to claim 1,
wherein the inorganic nitride contains at least one kind of nitride selected from the group consisting of boron nitride and aluminum nitride.

7. A composition comprising:
the surface-modified inorganic nitride according to claim 1; and
a curable compound.

8. The composition according to claim 7,
wherein the curable compound has a group selected from the group consisting of an oxiranyl group, an oxetanyl group, an acryloyl group, and a methacryloyl group.

9. The composition according to claim 7,
wherein the curable compound or a cured substance thereof exhibits liquid crystallinity.

10. A method of forming a thermally conductive material including the curing the composition according to claim 7.

11. A thermally conductive material comprising:
the surface-modified inorganic nitride according to claim 1.

12. The thermally conductive material according to claim 11 that is in the form of a sheet.

13. A heat dissipation sheet comprising the thermally conductive material according to claim 11.

14. A device with a thermally conductive layer, comprising:
a device; and
a thermally conductive layer which is disposed on the device and contains the thermally conductive material according to claim 11.

15. A method for manufacturing the surface-modified inorganic nitride according to claim 1, comprising:
a step of bringing the inorganic nitride into contact with the onium salt.

16. The surface-modified inorganic nitride according to claim 2,
wherein $C^+$ is the group represented by General Formula (4).

17. The surface-modified inorganic nitride according to claim 2,
wherein the inorganic nitride contains at least one kind of atom selected from the group consisting of a boron atom, an aluminum atom, and a silicon atom.

18. The surface-modified inorganic nitride according to claim 3,
wherein the inorganic nitride contains at least one kind of atom selected from the group consisting of a boron atom, an aluminum atom, and a silicon atom.

19. The surface-modified inorganic nitride according to claim 4,
wherein the inorganic nitride contains at least one kind of atom selected from the group consisting of a boron atom, an aluminum atom, and a silicon atom.

20. The surface-modified inorganic nitride according to claim 2,
wherein the inorganic nitride contains at least one kind of nitride selected from the group consisting of boron nitride and aluminum nitride.

* * * * *